United States Patent
Okada et al.

(10) Patent No.: US 9,376,571 B2
(45) Date of Patent: Jun. 28, 2016

(54) COLORANT DISPERSION LIQUID, METHOD FOR PRODUCING COLORANT DISPERSION LIQUID, COLOR RESIN COMPOSITION FOR COLOR FILTERS, COLOR FILTER, LIQUID CRYSTAL DISPLAY DEVICE, AND ORGANIC LIGHT-EMITTING DISPLAY DEVICE

(71) Applicants: DAI NIPPON PRINTING CO., LTD., Tokyo-to (JP); DNP FINE CHEMICALS CO., LTD., Yokohama-shi, Kanagawa (JP)

(72) Inventors: Masato Okada, Tokyo-to (JP); Daisuke Endo, Tokyo-to (JP); Michihiro Ogura, Tokyo-to (JP); Hiroaki Segawa, Tokyo-to (JP); Tomoki Murata, Tokyo-to (JP); Yoshihito Maeno, Tokyo-to (JP); Hiroshi Oshima, Yokohama (JP)

(73) Assignees: DAI NIPPON PRINTING CO., LTD., Tokyo-to (JP); DNP FINE CHEMICALS CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 14/766,320

(22) PCT Filed: Feb. 4, 2014

(86) PCT No.: PCT/JP2014/052584
§ 371 (c)(1),
(2) Date: Aug. 6, 2015

(87) PCT Pub. No.: WO2014/123124
PCT Pub. Date: Aug. 14, 2014

(65) Prior Publication Data
US 2015/0368473 A1    Dec. 24, 2015

(30) Foreign Application Priority Data

Feb. 8, 2013  (JP) ................................. 2013-023787

(51) Int. Cl.
| | | |
|---|---|---|
| G02B 5/20 | (2006.01) |
| C09B 67/46 | (2006.01) |
| G03F 7/00 | (2006.01) |
| C09B 11/12 | (2006.01) |
| H01L 27/32 | (2006.01) |
| G02B 5/22 | (2006.01) |
| C09B 11/24 | (2006.01) |
| G02F 1/1335 | (2006.01) |

(52) U.S. Cl.
CPC ............ C09B 67/0084 (2013.01); C09B 11/12 (2013.01); C09B 11/24 (2013.01); G02B 5/223 (2013.01); G02F 1/133514 (2013.01); G03F 7/0007 (2013.01); H01L 27/322 (2013.01); G02F 1/133516 (2013.01)

(58) Field of Classification Search
CPC . G03F 7/0007; G02B 5/223; G02F 1/133514; G02F 1/133516; H01L 27/322; C09B 67/0084; C09B 11/12; C09B 11/24
USPC ................ 430/7; 349/106; 359/891; 106/402
See application file for complete search history.

(56) References Cited

U.S. PATENT DOCUMENTS

| | | | |
|---|---|---|---|
| 2012/0154944 A1* | 6/2012 | Kanna | C09B 57/10 359/891 |
| 2014/0039201 A1 | 2/2014 | Okada et al. | |
| 2014/0125930 A1 | 5/2014 | Sawada | |
| 2014/0141178 A1 | 5/2014 | Okada | |
| 2014/0191213 A1 | 7/2014 | Sawada et al. | |
| 2014/0349101 A1* | 11/2014 | Kaneko | G03F 7/031 428/220 |

FOREIGN PATENT DOCUMENTS

| | | |
|---|---|---|
| GB | 744972 | 2/1956 |
| GB | 749308 | 5/1956 |
| JP | 2010-026334 A * | 2/2010 |
| JP | 2010-032999 A | 2/2010 |
| JP | 2010-211198 A | 9/2010 |
| JP | 2012-063429 A | 3/2012 |

| JP | 4911253 B1 | 4/2012 |
| JP | 4911256 B1 | 4/2012 |
| JP | 2012-236882 A | 12/2012 |
| JP | 2013-057052 A | 3/2013 |
| JP | 2013-057054 A | 3/2013 |
| JP | 2013-166872 A | 8/2013 |
| JP | 2013-203955 A | 10/2013 |
| WO | 91/13122 A1 | 9/1991 |
| WO | 2012/144520 A1 | 10/2012 |
| WO | 2012/144521 A1 | 10/2012 |

OTHER PUBLICATIONS

Computer-generated translation of JP 2010-026334 (Feb. 2010).*
International Search Report mailed Apr. 22, 2014; PCT/JP2014/052584.

\* cited by examiner

*Primary Examiner* — John A McPherson
(74) *Attorney, Agent, or Firm* — Ladas & Parry LLP

(57) ABSTRACT

The present invention is to provide a colorant dispersion liquid which is able to form a high-luminance coating film having better heat resistance compared to the case of using conventional dyes. Disclosed is a colorant dispersion liquid containing (A) a colorant, (B) a dispersant, and (C) a solvent, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

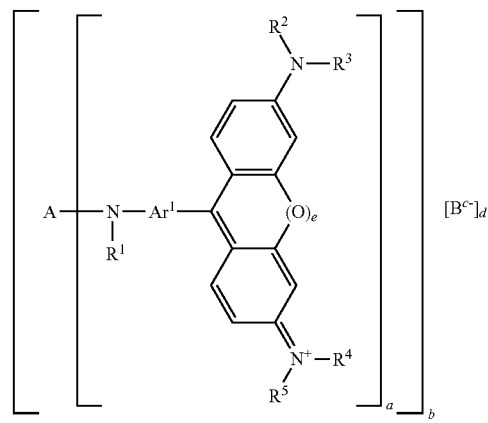

General Formula (I)

(The symbols in the formula are as described in the Description.)

14 Claims, 2 Drawing Sheets

COLORANT DISPERSION LIQUID, METHOD FOR PRODUCING COLORANT DISPERSION LIQUID, COLOR RESIN COMPOSITION FOR COLOR FILTERS, COLOR FILTER, LIQUID CRYSTAL DISPLAY DEVICE, AND ORGANIC LIGHT-EMITTING DISPLAY DEVICE

TECHNICAL FIELD

The present invention relates to a colorant dispersion liquid, a method for producing a colorant dispersion liquid, a color resin composition for color filters, a color filter, a liquid crystal display device, and an organic light-emitting display device.

BACKGROUND ART

Many thin image display devices as typified by displays, i.e., flat panel displays, have been released on the market, because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, organic light-emitting display devices such as organic EL displays, which emit light by themselves and thereby have high visibility, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and organic light-emitting display devices. For example, in the case of color LCDs, the amount of light is controlled by using a back light as the light source and electrically driving the liquid crystal. Colors are represented by the light that passed through the color filter. Accordingly, the color filter is indispensible for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices containing a color filter determine the design and performance of mobile terminal devices, because they are directly linked to the usable time and charging frequency of mobile terminal devices.

In general, a color filter has a transparent substrate, color layers made of color patterns of the three primary colors (red, green and blue), and a light shielding part formed on the transparent substrate so as to define each color pattern.

To form such color layers, a pigment dispersion method in which pigments with excellent heat resistance and light resistance are used as colorants, has been widely used. However, it is difficult for color filters produced by use of pigments to satisfy the latest demand for higher luminance.

As a means to achieve higher luminance, photosensitive resin compositions for color filters, which contain dyes, have been studied. Compared to pigments, dyes generally have a higher transmittance and are able to produce a high-luminance color filter. However, dyes are problematic in that they are inferior in heat resistance and light resistance to pigments and the chromaticity is likely to change when they are heated at high temperature in color filter production process, for example. Also, photosensitive resin compositions containing dyes have such a problem that aggregates are likely to be precipitated during drying process. Aggregates precipitated in a coating film lead to a remarkable deterioration in contrast and make it difficult to use the coating film as a color layer.

In Patent Literature 1, a specific color photosensitive resin composition containing a colorant, which contains a specific dye and a pigment, and a specific solvent is disclosed. According to Patent Literature 1, it is described that a coating film with high heat resistance and less coating unevenness is obtained from the color photosensitive resin composition.

In Patent Literature 2, a specific blue photosensitive resin composition containing, as a colorant, an organic solvent-soluble dye having a specific structure and an organic pigment is disclosed. According to Patent Literature 2, it is described that a color filter with high lightness is obtained by using the color photosensitive resin composition.

The specific dyes of Patent Literatures 1 and 2 are dissolved in solvents and then used. They are insufficient in heat resistance and light resistance. They are also insufficient in stability, since they contain polar solvents for dissolving the dyes.

Disclosed in Patent Literatures 3 and 4 include: specific color materials containing divalent or higher anions and divalent or higher cations, in which dye skeletons are crosslinked by crosslinking groups, and color filters using the color materials. It is disclosed that the color materials are excellent in heat resistance, and the color filters using the color materials have high contrast and are excellent in solvent resistance and electric reliability.

In Patent Literature 5, a dye dispersion liquid in which a specific dye is dispersed in a solvent with the aid of a specific dispersant, and so on are disclosed. It is described that by using the dye dispersion liquid, no aggregates are precipitated during coating film formation, and a color filter having high luminance, as well as excellent heat resistance and light resistance, can be obtained.

CITATION LIST

Patent Literature 1: Japanese Patent Application Laid-Open (JP-A) No. 2010-211198
Patent Literature 2: JP-A No. 2010-32999
Patent Literature 3: International Publication No. WO2012/144520
Patent Literature 4: International Publication No. WO 2012/144521
Patent Literature 5: Japan Patent No. 4911253

SUMMARY OF INVENTION

Technical Problem

Since excellent heat resistance and high luminance can be expected, the inventors of the present invention have studied the use of color materials described in Patent Literatures 3 and 4. However, in order to adjust the color tones of the color materials to desired color tones, it is needed to use the color materials in combination with other colorants.

In the case of using pigments as other colorants, there is a problem of a decrease in luminance. In the case of using dyes, there is a problem of a decrease in heat resistance and light resistance, resulting in a decrease in luminance.

The present invention has been achieved in light of the above circumstances. An object of the present invention is to provide: a colorant dispersion liquid which is able to form a high-luminance coating film having better heat resistance compared to the case of using conventional dyes; a color resin composition for color filters, which is able to form a high-luminance color layer having excellent heat resistance; a high-luminance color filter using the color resin composition; a liquid crystal display device having the color filter; and an organic light-emitting display device.

Solution to Problem

A colorant dispersion liquid of the present invention contains (A) a colorant, (B) a dispersant, and (C) a solvent, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

A method for producing a colorant dispersion liquid according to the present invention contains (A) a colorant, (B) a dispersant, and (C) a solvent, wherein the colorant (A) contains a color material represented by the general formula (I) and a xanthene-based dye, and a solubility of the color material in the solvent (C) and that of the xanthene-based dye in the solvent (C) are each 0.2 (g/100 g solvent) or less at 23° C., wherein the method has a step of adding the color material, the xanthene-based dye and the dispersant (B) to the solvent (C) and co-dispersing the color material and the xanthene-based dye.

A color resin composition for color filters according to the present invention contains (A) a colorant, (B) a dispersant, (C) a solvent and (D) a binder component, wherein the colorant (A) contains a color material represented by the general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B).

In the colorant dispersion liquid, the method for producing a colorant dispersion liquid, and the color resin composition for color filters according to the present invention, from the view point of light resistance, the xanthene-based dye is preferably a compound represented by the following general formula (II):

General Formula (I)

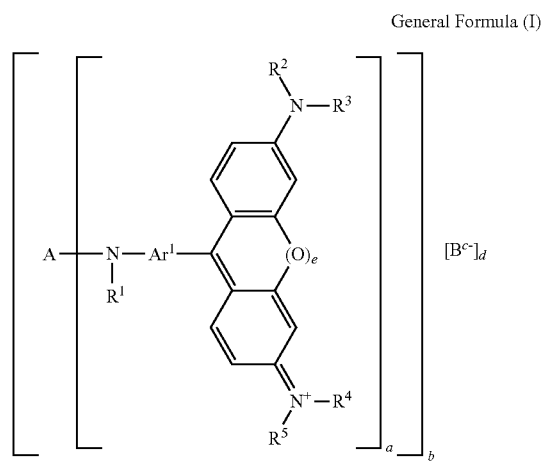

General Formula (II)

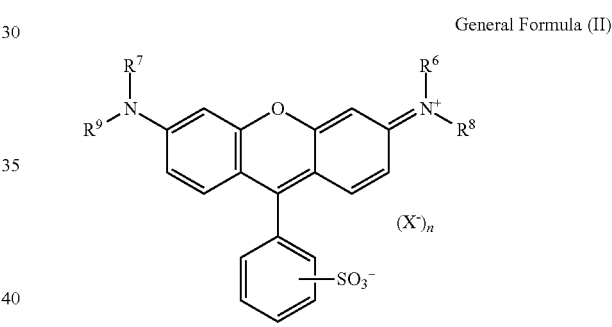

wherein each of $R^6$ and $R^7$ is independently an alkyl group or an aryl group; each of $R^8$ and $R^9$ is independently an aryl group or a heteroaryl group; and $R^6$ to $R^9$ can be the same or different from each other.

In the colorant dispersion liquid, the method for producing a colorant dispersion liquid, and the color resin composition for color filters according to the present invention, it is preferable that the dispersant (B) contains a urethane-based dispersant, and at least the xanthene-based dye is dispersed by the urethane-based dispersant, from the point of view that excellent dispersion is possible by using the dispersant in a small amount.

In the colorant dispersion liquid, the method for producing a colorant dispersion liquid, and the color resin composition for color filters according to the present invention, from the viewpoint of increasing heat resistance, the anion ($B^{c-}$) of the general formula (I) is preferably a polyoxometalate anion having a tungsten:molybdenum molar ratio of 100:0 to 90:10.

In the colorant dispersion liquid, the method for producing a colorant dispersion liquid, and the color resin composition for color filters according to the present invention, from the viewpoint of increasing heat resistance, it is preferable that the color resin composition further contains an antioxidant.

A color filter of the present invention contains at least a transparent substrate and color layers disposed on the subwherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent anion; each of $R^1$ to $R^5$ is independently a hydrogen atom, an alkyl group which can have a substituent group, or an aryl group which can have a substituent group; $R^2$ and $R^3$ can be bound to form a ring structure, and/or $R^4$ and $R^5$ can be bound to form a ring structure; $Ar^1$ is a divalent aromatic group which can have a substituent group; a plurality of $R^1$s can be the same or different; a plurality of $R^2$s can be the same or different; a plurality of $R^3$s can be the same or different; a plurality of $R^4$s can be the same or different; a plurality of $R^5$s can be the same or different; and a plurality of $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

strate, wherein at least one of the color layers is a color layer which is a cured product of the color resin composition for color filters according to the present invention.

The present invention provides a liquid crystal display device containing the color filter of the present invention, a counter substrate, and a liquid crystal layer disposed between the color filter and the counter substrate.

The present invention also provides an organic light-emitting display device containing the color filter of the present invention and an organic light-emitting material.

Advantageous Effects of Invention

According to the present invention, the following can be provided: a colorant dispersion liquid which is able to form a high-luminance coating film having better heat resistance compared to the case of using conventional dyes; a color resin composition for color filters, which is able to form a high-luminance color layer having excellent heat resistance; a high-luminance color filter using the color resin composition; a liquid crystal display device having the color filter; and an organic light-emitting display device.

DESCRIPTION OF EMBODIMENTS

Figure 1:
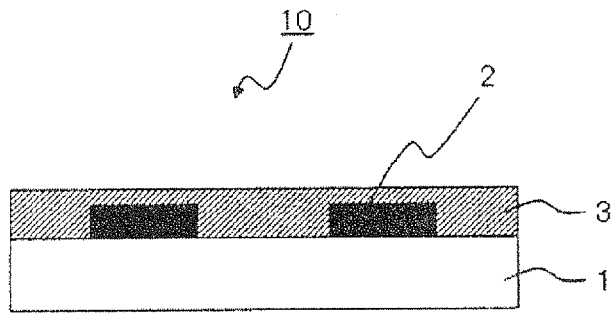
FIG. 1 is a schematic view showing an example of the color filter of the present invention.

Hereinafter, a colorant dispersion liquid, a method for producing a colorant dispersion liquid, a color resin composition for color filters, a color filter, a liquid crystal display device, and an organic light-emitting display device, which are according to the present invention, will be described in order.

In the present invention, "light" encompasses electromagnetic waves in visible and non-visible wavelength ranges and radial rays. Radial rays include microwaves and electron beams, more specifically, electromagnetic waves having a wavelength of 5 μm or less and electron beams.

Also in the present invention, "(meth)acrylic" means any one of acrylic and methacrylic, and "(meth)acrylate" means any one of acrylate and methacrylate.

Also in the present invention, "organic group" means a group having one or more carbon atoms.

[Colorant Dispersion Liquid]

The colorant dispersion liquid of the present invention contains (A) a colorant, (B) a dispersant, and (C) a solvent, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

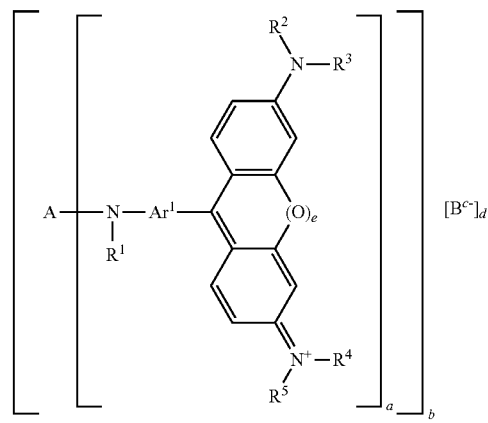

General Formula (I)

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent anion; each of $R^1$ to $R^5$ is independently a hydrogen atom, an alkyl group which can have a substituent group, or an aryl group which can have a substituent group; $R^2$ and $R^3$ can be bound to form a ring structure, and/or $R^4$ and $R^5$ can be bound to form a ring structure; $Ar^1$ is a divalent aromatic group which can have a substituent group; a plurality of $R^1$s can be the same or different; a plurality of $R^2$s can be the same or different; a plurality of $R^3$s can be the same or different; a plurality of $R^4$s can be the same or different; a plurality of $R^5$s can be the same or different; and a plurality of $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

In the colorant dispersion liquid of the present invention, the above-specified color material and xanthene-based dye are selected as the colorant (A) and combined together, and the specific color material and xanthene-based dye are dispersed in the solvent (C), in which the specific color material and xanthene-based dye are substantially insoluble, with the aid of the dispersant (B). Therefore, the colorant dispersion liquid becomes a colorant dispersion liquid which is able to form a coating film with higher luminance and better heat resistance compared to the case of using conventional dyes.

The mechanism that the above-described effects are exerted by the above-specified combination is not clear yet; however, it is presumed as follows.

The color material represented by the general formula (I) (hereinafter may be simply referred to as "color material") has a plurality of color-forming moieties, and the color-forming moieties have a similar basic skeleton to that of basic dyes. Therefore, as with basic dyes, the color material can achieve high luminance. In the present invention, the colorant (A) uses such a color material represented by the general formula (I) in combination with the xanthene-based dye having high transmittance. Therefore, a very high luminance can be achieved.

As described below, the color material represented by the general formula (I) has excellent heat resistance, because it is able to form a molecular association. Moreover, by dispersing the color material represented by the general formula (I) and the xanthene dye in the solvent (C), in which the color material and the dye are substantially insoluble, with the aid of the dispersant (B), the color material and the xanthene-based dye are dispersed in the solvent in the state of fine particles.

As just described, the colorant being dispersed in the state of fine particles aggregates at the molecular level. Therefore, it is presumed that ion pairs of the colorant are less likely to dissociate or decompose, and compared to dyes dissolved in solution, heat resistance is increased higher. As with pigments, by using the dispersant, the colorant in such a fine particle state can increase dispersibility and dispersion stability in solvent. In the colorant dispersion liquid of the present invention, the color material represented by the general formula (I) and the xanthene-based dye can be homogeneously dispersed in the solvent, in the state of finely-refined particles surrounded by the dispersant. Therefore, by using the colorant dispersion liquid, the colorant is less likely to cause color deterioration even when it is heated, so that the original color of the colorant can be retained, and high transmittance can be obtained. In addition, since the colorant components are refined, a coating film that can satisfy the demand for higher luminance, can be formed.

The colorant dispersion liquid of the present invention contains at least the colorant (A), the dispersant (B) and the solvent (C). It can further contain other components, as long as the effects of the present invention are not impaired.

Hereinafter, the components of such a colorant dispersion liquid of the present invention will be described in detail.
[Colorant (A)]

The colorant (A) used in the present invention contains at least the color material represented by the following general formula (I) and the xanthene-based dye. It can further contain other colorant, as long as the effects of the present invention are not impaired. In the present invention, by using the color material represented by the general formula (I) in combination with the xanthene-based dye, color tones that cannot be realized by the use of only the color material represented by the general formula (I), can be realized, and a color filter with excellent heat resistance and high luminance can be obtained.
<Color Material Represented by the General Formula (I)>

In the present invention, the color material represented by the following general formula (I) is used as the colorant. By using the color material, a color filter with higher luminance can be achieved, and a color layer with excellent solvent resistance and electric reliability can be formed.

General Formula (I)

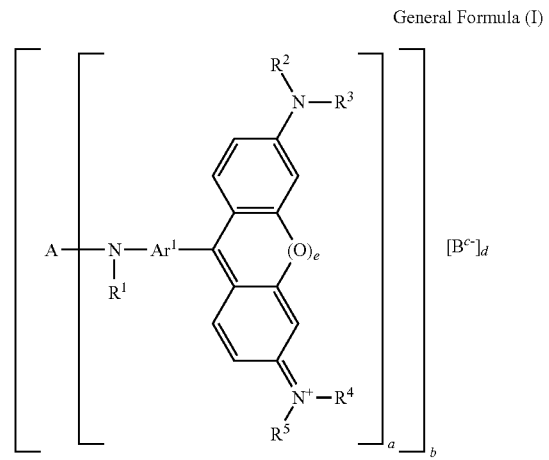

In the general formula (I), A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent anion; each of $R^1$ to $R^5$ is independently a hydrogen atom, an alkyl group which can have a substituent group, or an aryl group which can have a substituent group; $R^2$ and $R^3$ can be bound to form a ring structure, and/or $R^4$ and $R^5$ can be bound to form a ring structure; $Ar^1$ is a divalent aromatic group which can have a substituent group; a plurality of $R^1$s can be the same or different; a plurality of $R^2$s can be the same or different; a plurality of $R^3$s can be the same or different; a plurality of $R^4$s can be the same or different; a plurality of $R^5$s can be the same or different; and a plurality of $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

Figure 4:
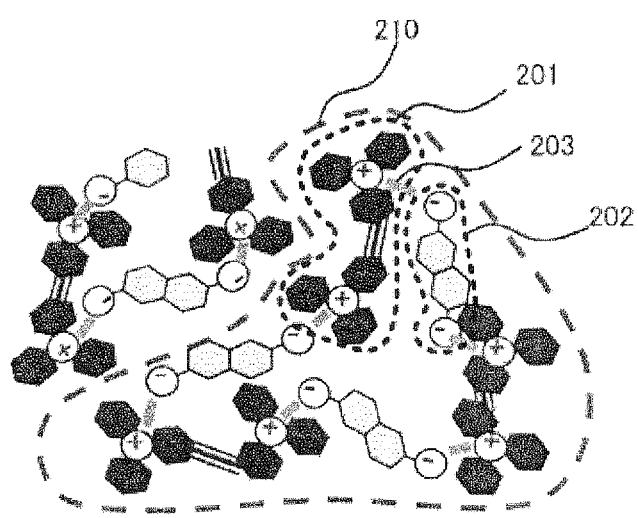
FIG. 4 is a schematic view showing a molecular association state of the color material represented by the general formula (I).

As shown in FIG. 4, the color material represented by the general formula (I) contains divalent or higher counter anions 202 and divalent or higher cations 201. Therefore, it is presumed that in the aggregate of the color material, each of the anions and each of the cations do not merely form an ionic bond on a one molecule-to-one molecule (one-to-one) basis, but a molecular association 210 is formed, in which plural molecules are connected through ionic bonds 203 and associated. Therefore, the apparent molecular weight of the color material represented by the general formula (I) is significantly more than the molecular weight of conventional lake pigments. Due to the formation of such a molecular association, the cohesion in a solid state is increased higher, thus decreasing thermal motions. Therefore, it is presumed that dissociation of the ion pairs and decomposition of the cationic moieties can be inhibited, and heat resistance is increased.

In the general formula (I), A is an "a"-valent organic group in which a carbon atom directly bound to N (nitrogen atom) has no π bond. The organic group is an aliphatic hydrocarbon group having a saturated aliphatic hydrocarbon group at least at a terminal position directly bound to N, or an aromatic group having the aliphatic hydrocarbon group, and O (oxygen atom), S (sulfur atom), N (nitrogen atom) can be contained in a carbon chain of the organic group. Since the carbon atom directly bound to N has no π bond, the color characteristics of the cationic color-forming moiety, such as color tone and transmittance, are not affected by the linking group A and other color-forming moieties, thereby allowing the same color as that of a single color-forming moiety. From the viewpoint of heat resistance, it is preferable that A does not have a siloxane bond, and it is also preferable that A does not have a silicon atom (Si).

In A, as long as the carbon atom being at the terminal position and directly bound to N has no π bond, the aliphatic hydrocarbon group having a saturated aliphatic hydrocarbon group at least at a terminal position directly bound to N, can be in a straight-chain, branched-chain or cyclic form, have an unsaturated bond in carbon atoms except the one in the terminal position, have a substituent group, or contain O, S, N in the carbon chain. For example, a carbonyl group, a carboxyl group, an oxycarbonyl group and/or an amide group can be contained, and a hydrogen atom can be substituted by a halogen atom, etc.

Also in A, as the aromatic group having an aliphatic hydrocarbon group, there may be exemplified a monocyclic or polycyclic aromatic group which has an aliphatic hydrocarbon group having a saturated aliphatic hydrocarbon group at least at the terminal position directly bound to N. The aromatic group can have a substituent group, and it can be a heterocyclic ring containing O, S or N.

Particularly, from the viewpoint of skeleton toughness, it is preferable that A contains a cyclic aliphatic hydrocarbon group or an aromatic group.

As the cyclic aliphatic hydrocarbon group, a bridged alicyclic hydrocarbon group is particularly preferable from the viewpoint of skeleton toughness. The bridged alicyclic hydrocarbon group refers to a polycyclic aliphatic hydrocarbon group having a bridged structure in the aliphatic ring and having a polycyclic structure. The examples include norbornane, bicyclo[2,2,2]octane and adamantane. Of bridged alicyclic hydrocarbon groups, norbornane is preferable. Examples of the aromatic group include groups containing a benzene ring and those containing a naphthalene ring. Of them, groups containing a benzene ring are preferable. For example, when A is a divalent organic group, examples of the divalent organic group include a straight-chain, branched-chain or cyclic alkylene group having 1 to 20 carbon atoms, and an aromatic group in which two alkylene groups each having 1 to 20 carbon atoms are bound by substitution, such as a xylylene group.

In A, the valence "a" refers to the number of cationic color-forming moieties constituting the cation, and "a" is an integer of 2 or more. Because the valence "a" of the cation is 2 or more, the colorant of the present invention has excellent heat resistance. The valence "a" of the cation is particularly preferably 3 or more. The upper limit of "a" is not particularly limited. From the viewpoint of ease of production, "a" is preferably 4 or less, more preferably 3 or less.

The alkyl group as each of $R^1$ to $R^5$ is not particularly limited. Examples of the alkyl group include a straight- or branched-chain alkyl group having 1 to 20 carbon atoms. Of them, preferred is a straight- or branched-chain alkyl group having 1 to 8 carbon atoms, more preferred is a straight- or branched-chain alkyl group having 1 to 5 carbon atoms, from the viewpoint of luminance and heat resistance. Of them, still more preferred is an ethyl group or a methyl group. A substituent group that the alkyl group can have is not particularly limited. The examples include an aryl group, a halogen atom and a hydroxyl group. As the substituted alkyl group, a benzyl group can be exemplified.

The aryl group as each of $R^1$ to $R^5$ is not particularly limited. The examples include a phenyl group and a naphthyl group. As a substituent group that the aryl group can have, an alkyl group and a halogen atom can be exemplified.

"$R^2$ and $R^3$ can be bound to form a ring structure, and/or $R^4$ and $R^5$ can be bound to form a ring structure" means that $R^2$ and $R^3$ form a ring structure through a nitrogen atom and/or $R^4$ and $R^5$ form a ring structure through a nitrogen atom. The ring structure is not particularly limited, and the examples include a pyrrolidine ring, a piperidine ring and a morpholine ring.

Particularly, from the viewpoint of chemical stability, it is preferable that each of $R^1$ to $R^5$ is independently a hydrogen atom, an alkyl group having 1 to 5 carbon atoms, or a phenyl group. Or, it is preferable that $R^2$ and $R^3$ are bound to form a pyrrolidine ring, a piperidine ring or a morpholine ring, and/or $R^4$ and $R^5$ are bound to form a pyrrolidine ring, a piperidine ring or a morpholine ring.

Each of $R^1$ to $R^5$ can independently have the above structure. Particularly, from the viewpoint of color purity, it is preferable that $R^1$ is a hydrogen atom. From the viewpoint of ease of production and availability of raw materials, it is more preferable that all of $R^2$ to $R^5$ are the same.

The divalent aromatic group as $Ar^1$ is not particularly limited. The aromatic group as $Ar^1$ can be the same as those described above as the aromatic group as A.

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, from the point of view that the structure is simple and the raw materials are low-cost.

A plurality of $R^1$s per molecule can be the same or different; a plurality of $R^2$s per molecule can be the same or different; a plurality of $R^3$s per molecule can be the same or different; a plurality of $R^4$s per molecule can be the same or different; a plurality of $R^1$s per molecule can be the same or different; and a plurality of $Ar^1$s per molecule can be the same or different. Depending on the combination of $R^1$ to $R^5$ and $Ar^1$, it is possible to produce a desired color.

In the color material represented by the general formula (I), the anionic moiety ($B^{c-}$) is not particularly limited, and it can be an organic anion or inorganic anion. As used herein, "organic anion" means an anion containing at least one carbon atom. "Inorganic anion" means an anion containing no carbon atom. In the present invention, from the viewpoint of high luminance and excellent heat resistance, $B^{c-}$ is preferably an inorganic anion.

When $B^{c-}$ is an organic anion, the structure is not particularly limited. Concrete examples of the organic anion include those mentioned in International Publication No. WO2012/144520.

From the viewpoint of stabilizing the color material, particularly preferred is an organic anion having two or more monovalent anionic substituent groups per molecule. Concrete examples of the anionic substituent group include imidic acid groups such as $-SO_2N^-SO_2CH_3$, $-SO_2N^-COCH_3$, $-SO_2N^-SO_2CF_3$, $-SO_2N^-COCF_3$, $-CF_2SO_2N^-SO_2CH_3$, $-CF_2SO_2N^-COCH_3$, $-CF_2SO_2N^-SO_2CF_3$ and $-CF_2SO_2N^-COCF_3$, and $-SO_3^-$, $-CF_2SO_3^-$, $-PO_3^{2-}$, $-COO^-$, $-CF_2PO_3^{2-}$ and $-CF_2COO^-$. From the viewpoint of having high acidity and being highly effective in stabilizing the cations and maintaining the color state by virtue of the high acidity, imidic acid groups, $-SO_3^-$ and $-CF_2SO_3^-$ are preferred, and $-SO_3^-$ (a sulfonato group) is more preferred. In the case of substituting a plurality of anionic substituent groups, substituent groups of the same kind or different kinds of substituent groups can be used.

On the other hand, when $B^{c-}$ is an inorganic anion, the structure is not particularly limited, and there may be mentioned anions of divalent or higher oxo acids (such as phosphate ion, sulfate ion, chromate ion, tungstate ion ($WO_4^{2-}$) and molybdate ion ($MoO_4^{2-}$)); inorganic anions such as a polyoxometalate ions formed by condensation of a plurality of oxo acids; and mixtures thereof.

The polyoxometalate can be isopolyoxometalate ions $(M_mO_n)^{c-}$ or heteropolyoxometalate ions $(X_lM_mO_n)^{c-}$. In the ionic formulae, M is a polyatom; X is a heteroatom; "m" is the compositional ratio of the polyatom; and "n" is the compositional ratio of an oxygen atom. As the polyatom (M), there may be mentioned Mo, W, V, Ti, Nb, etc. As the heteroatom (X), there may be mentioned Si, P, As, S, Fe, Co, etc. A counter cation such as $Na^+$ or $H^+$ can be contained in a part of the heteroatom.

From the viewpoint of high luminance and excellent heat resistance, preferred is an anion of an inorganic acid containing at least one of tungsten (W) and molybdenum (Mo). From the viewpoint of light resistance, preferred is an anion of an inorganic acid containing tungsten and molybdenum.

As the anion of the inorganic acid containing at least one of tungsten (W) and molybdenum (Mo), for example, there may be mentioned a tungstate ion $[W_{10}O_{32}]^{4-}$ and a molybdate ion $[Mo_6O_{19}]^{2-}$, which are isopolyoxometalates, and a phosphotungstate ion $[PW_{12}O_{40}]^{3-}$, a silicotungstate ion $[SiW_{12}O_{40}]^{4-}$, a phosphomolybdate ion $[PMo_{12}O_{40}]^{3-}$, phosphotungstic molybdate ions $[PW_{12-x}Mo_xO_{40}]^{3-}$ and $H_3[PW_{2-x}Mo_xO_7]^{4-}$, which are heteropolyoxometalates. Of these examples, from the viewpoint of heat resistance and availability of raw materials, the anion of the inorganic acid containing at least one of tungsten (W) and molybdenum (Mo) is preferably a heteropolyoxometalate, more preferably a heteropolyoxometalate containing P (phosphorus).

In the anion of the inorganic acid containing at least one of tungsten (W) and molybdenum (Mo), the tungsten:molybdenum molar ratio is not particularly limited. From the viewpoint of high luminance and excellent heat resistance, preferred is an inorganic acid anion having a tungsten:molybdenum molar ratio of 100:0 to 90:10.

In the general formula (I), "b" refers to the number of cations, and "d" refers to the number of anions in the molecular association. In the general formula (I), each of "b" and "d" is an integer of 1 or more. When "b" is 2 or more, the cations in the molecular association can be of a single kind or a combination of two or more kinds. When "d" is 2 or more, the anions in the molecular association can be a single kind or a combination of two or more kinds, and a combination of an organic anion and an inorganic anion can also be used.

In the general formula (I), "e" is an integer of 0 or 1. In the general formula (I), "e=0" indicates a triarylmethane skeleton, and "e=1" indicates a xanthene skeleton. In the general formula (I), a plurality of "e"s can be the same or different. The examples include a cationic moiety having a plurality of triarylmethane or xanthene skeletons only, and a cationic moiety having both triarylmethane and xanthene skeletons per molecule. From the viewpoint of color purity, the anionic moiety having the same skeletons only is preferable. On the other hand, by having the cationic moiety including both triarylmethane and xanthene skeletons, it is possible to adjust the color of the color material represented by the general formula (I) to a desired color.

When the color material represented by the general formula (I) has a xanthene skeleton, it can be contained in the below-described xanthene-based dye. However, in the present invention, as long as it corresponds to the color material represented by the general formula (I), it is deemed and handled as a color material that corresponds to the color material represented by the general formula (I).

The method for producing the color material represented by the general formula (I) is not particularly limited. For example, it can be obtained by the production method described in International Publication No. WO2012/144520.

<Xanthene-Based Dye>

In the present invention, the xanthene-based dye means a dye having a xanthene skeleton. In the present invention, the xanthene-based dye is preferably a dye having an acidic group. As the acidic group, there may be mentioned a carboxy group (—COOH), a carboxylato group (—COO⁻), a carboxylic acid salt (—COOM wherein M is a metal atom), a sulfonato group (—SO₃⁻), a sulfo group (—SO₃H), a sulfonic acid salt (—SO₃M wherein M is a metal atom), etc. From the viewpoint of showing high heat resistance, it is preferable to have at least one of a sulfonato group (—SO₃⁻), a sulfo group (—SO₃H) and a sulfonic acid salt (—SO₃M). As the metal atom M, there may be mentioned a sodium atom, a potassium atom, etc. The xanthene-based dye having the acidic group has a functional group that is convertible to an acid. Therefore, for example, by using the dye in combination with the dispersant (B) having an amine value, an acid-base interaction with the dispersant is produced, and the xanthene-based dye is fixed in the dispersant and stabilized. Such a stabilization state of the xanthene-based dye and the dispersant is presumed to be that, centering around the xanthene-based dye, colorant affinity parts of the dispersant surround the xanthene-based dye and solvent affinity parts of the dispersant are located on the outside thereof, that is, a micelle of the xanthene-based dye and the dispersant is formed.

In the present invention, as the xanthene-based dye, a compound represented by the following general formula (II') can be used:

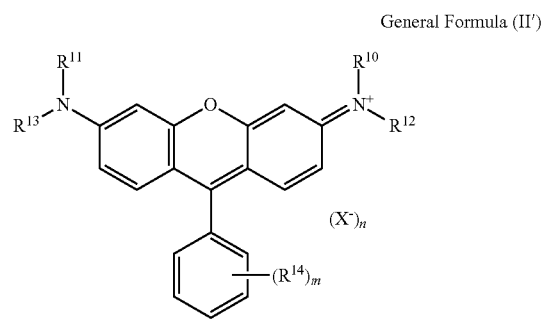

General Formula (II')

wherein each of $R^{10}$ to $R^{13}$ is independently a hydrogen atom, an alkyl group, an aryl group or a heteroaryl group; $R^{10}$ and $R^{12}$ can be bound to form a ring structure; $R^{11}$ and $R^{13}$ can be bound to form a ring structure; $R^{14}$ is an acidic group; X is a halogen atom; "m" is an integer of 0 to 5; the general formula (II') has one or more acidic groups; and "n" is an integer of 0 or more.

The alkyl group as each of $R^{10}$ to $R^{13}$ is not particularly limited. For example, there may be mentioned a straight- or branched-chain alkyl group which has 1 to 20 carbon atoms and which can have a substituent group. Preferred is a straight- or branched-chain alkyl group having 1 to 8 carbon atoms. More preferred is a straight- or branched-chain alkyl group having 1 to 5 carbon atoms. The substituent group that the alkyl group can have is not particularly limited. For example, there may be mentioned an aryl group, a halogen atom and a hydroxyl group. As the substituted alkyl group, there may be mentioned a benzyl group, etc. Also, the substituted alkyl group can further have a halogen atom or acidic group as a substituent group.

The aryl group as each of $R^{10}$ to $R^{13}$ is not particularly limited. For example, there may be mentioned an aryl group which has 6 to 20 carbon atoms and which can have a substituent group. Preferred is a group having a phenyl group, naphthyl group, etc. As the heteroaryl group as each of $R^{10}$ to $R^{13}$, there may be mentioned a heteroaryl group which has 5 to 20 carbon atoms and which can have a substituent group. Preferred is one having a nitrogen atom, an oxygen atom, a sulfur atom as a heteroatom.

As the substituent group that the aryl group or heteroaryl group can have, for example, there may be mentioned an alkyl group having 1 to 5 carbon atoms, a halogen atom, an acidic group, a hydroxyl group, an alkoxy group, a carbamoyl group and a carboxylic acid ester group.

$R^{10}$ to $R^{13}$ can be the same as or different from each other.

Also, "n" means the number of anions per molecule of the xanthene-based dye. From the viewpoint of heat resistance, "n" is preferably a number which makes the number of positive charges per molecule equal to the number of negative charges per molecule. From the viewpoint of heat resistance, it is also preferable that "n" is 0 or 1.

Concrete examples of such a xanthene-based dye include Acid Red 51, 52, 87, 92, 94, 289, 388, C. I. Acid Violet 9, 30, 102, Sulforhodamine G, Sulforhodamine B, Sulforhodamine 101 and Sulforhodamine 640. In addition, as preferred examples, there may be mentioned xanthene dyes mentioned in Japanese Patent Application Laid-Open (JP-A) No. 2010-32999 and Japan Patent No. 4492760.

In the present invention, from the viewpoint of excellent light resistance, it is preferable that the xanthene-based dye is a compound represented by the following general formula (II):

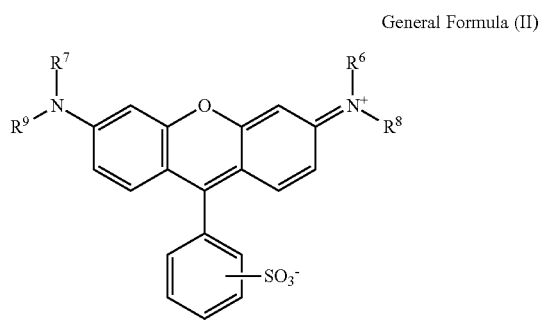

General Formula (II)

wherein each of $R^6$ and $R^7$ is independently an alkyl group or an aryl group, and each of $R^8$ and $R^9$ is independently an aryl group or a heteroaryl group.

The alkyl group as $R^6$ and $R^7$ is not particularly limited. For example, there may be mentioned a straight- or branched-chain alkyl group which has 1 to 20 carbon atoms and which can have a substituent group. Preferred is a straight- or branched-chain alkyl group having 1 to 8 carbon atoms. More preferred is a straight- or branched-chain alkyl group having 1 to 5 carbon atoms. The substituent group that the alkyl group can have is not particularly limited. For example, there may be mentioned an aryl group, a halogen atom and a hydroxyl group. As the substituted alkyl group, there may be mentioned a benzyl group, etc. Also, the substituted alkyl group can further have a halogen atom as a substituent group.

The aryl group as each of $R^6$ to $R^9$ is not particularly limited. For example, there may be mentioned an aryl group which has 6 to 20 carbon atoms and which can have a substituent group. Preferred is a group having a phenyl group, naphthyl group, etc. As the heteroaryl group as $R^8$ and $R^9$, there may be mentioned a heteroaryl group which has 5 to 20 carbon atoms and which can have a substituent group. Preferred is one having a nitrogen atom, an oxygen atom, a sulfur atom as a heteroatom.

As the substituent group that the aryl group or heteroaryl group can have, for example, there may be mentioned an alkyl group having 1 to 5 carbon atoms, a halogen atom, a hydroxyl group, an alkoxy group, a carbamoyl group, and a carboxylic acid ester group.

In the general formula (II), from the viewpoint of light resistance, $R^6$ to $R^9$ have no acidic group.

In the general formula (II), the substitution position of the sulfonato group (—$SO_3^-$) of the benzene ring attached to the xanthene skeleton is not particularly limited. It is preferable that with respect to the xanthene skeleton, the sulfonato group (—$SO_3^-$) is in the ortho- or para-position. From the viewpoint of light resistance, it is preferable that the sulfonato group is substituted in the ortho-position with respect to the xanthene skeleton.

The compound represented by the general formula (II) has one sulfonato group and has no metal ion or halogen atom. $R^6$ to $R^9$ are not hydrogen atoms. $R^8$ and $R^9$ are characterized in that they are each an aryl group or heteroaryl group.

The compound represented by the general formula (II) has a cationic xanthene skeleton and one anionic sulfonato group, so that it has no metal ion or halogen ion and is electrically stable. Therefore, it is presumed that even when dispersed in a solvent, the compound is not dissociated and has excellent stability. Therefore, the compound is excellent in heat resistance and light resistance and, for example, when the compound is used as a color filter for liquid crystal display devices, impurity ions are not eluted from the color filter into liquid crystal layers, so that negative influence on liquid crystal display drive can be prevented.

Also, a nitrogen atom has an aromatic substituent group such as an aryl group or heteroaryl group, so that the lone electron pair of the nitrogen atom resonates with not only the xanthene skeleton but also the aryl group or heteroaryl group, thereby making the molecules more stable. In addition, since a nitrogen atom is not directly bound to a hydrogen atom, no hydrogen atom is dissociated from a nitrogen atom. Therefore, the dye is not destabilized. Because of these reasons, the compound represented by the general formula (II) is stable even when it is irradiated with light, and it has excellent light resistance. Therefore, a high-luminance coating film or color layer with excellent light resistance can be formed by using the compound.

The method for producing the compound represented by the general formula (II') is not particularly limited. For example, it can be obtained by reference to JP-A No. 2010-211198. The compound represented by the general formula (II) can be obtained by a substitution reaction of the halogen atom of a compound represented by the following general formula (A) with an amine compound having a desired substituent group:

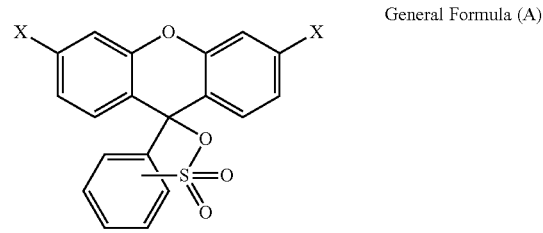

General Formula (A)

wherein X is a halogen atom, and a plurality of Xs can be the same as or different from each other.

The compound represented by the general formula (A) and the amine compound having the desired substituent group are refluxed in a solvent. The thus-obtained reaction solution is subjected to hot filtration to remove insoluble substances. Then, part of the solvent is removed. The reaction solution is added to diluted hydrochloric acid. Then, water is added thereto and the mixture is stirred, thereby obtaining the compound represented by the general formula (II).

Also, a xanthene dye in which —$N(R^6)(R^8)$ and —$N(R^7)(R^9)$ of the compound represented by the general formula (II) have different structures and are asymmetric, can be obtained at a high yield by (a) a method in which a first amine compound having a desired substituent group (such as a compound corresponding to —N(R$^6$)(R$^8$)) is gradually added in a dropwise manner to a highly diluted solution obtained by diluting the compound represented by the general formula (A) about 100- to 1,000-fold; the mixture is reacted; and then a second amine compound having a desired substituent group (such as a compound corresponding to —N(R$^7$)(R$^9$)) is added thereto and the mixture is reacted, or (b) a method in which a mixed solution of the first and second amine compounds mixed at a molar ratio of 1:1 is slowly added in a dropwise manner to the solution of the compound represented by the general formula (A) and the mixture is reacted.

As the halogen atom as X, there may be mentioned a fluorine atom, a chlorine atom, a bromine atom, etc. Preferred is a chlorine atom.

The compound represented by the general formula (A) and the amine compound having the desired substituent group can be synthesized by known methods, or they can be commercially-available products.

<Other Colorant>

In order to control color tone, the colorant (A) can further contain other colorant, to the extent that does not impair the effects of the present invention. As the other colorant, there may be mentioned known pigments and dyes, and they can be used alone or in combination of two or more kinds. The content of the other colorant is not particularly limited, as long as the effects of the present invention are not impaired, and can be the same as the case of the below-described color resin composition for color filters.

<Compounding Ratio of the Colorant>

The compounding ratio of the color material represented by the general formula (I) and the xanthene-based dye can be appropriately adjusted so as to obtain the desired color tone.

In particular, with respect to 100 parts by mass of the total colorant (A), the content of the color material represented by the general formula (I) is preferably 40 to 99.9 parts by mass, more preferably 70 to 99 parts by mass.

Also, with respect to 100 parts by mass of the total colorant (A), the content of the xanthene-based dye is preferably 0.1 to 60 parts by mass, more preferably 1 to 30 parts by mass.

[(B) Dispersant]

In the colorant dispersion liquid of the present invention, the color material represented by the general formula (I) and the xanthene-based dye are dispersed in the solvent by the dispersant (B) for use. The dispersant (B) can be selected from those that are conventionally used as dispersants. As the dispersant, for example, there may be used surfactants such as cationic, anionic, nonionic, amphoteric, silicone-based and fluorine-based dispersing agents. Among surfactants, polymer surfactants (polymer dispersants) are preferred from the viewpoint of homogeneous, fine dispersion.

Examples of polymer dispersants include (co)polymers of unsaturated carboxylic esters such as polyacrylic ester; (partial) amine salts, (partial) ammonium salts or (partial) alkylamine salts of (co)polymers of unsaturated carboxylic acids, such as polyacrylic acid; (co)polymers of hydroxyl group-containing unsaturated carboxylic esters, such as hydroxyl group-containing polyacrylic ester, and modified products thereof; polyurethanes; unsaturated polyamides; polysiloxanes; long-chain polyaminoamide phosphates; polyethyleneimine derivatives (amides obtained by reaction of poly(lower alkyleneimines) and free carboxyl group-containing polyesters, and bases thereof); and polyallylamine derivatives (reaction products obtained by reaction of polyallylamine with one or more compounds selected from the group consisting of the following three compounds: a free carboxyl group-containing polyester, a free carboxyl group-containing polyamide and a free carboxyl group-containing co-condensate of ester and amide (polyesteramide).

Particularly preferred polymer dispersants are polymer dispersants which have an amine value and in which a nitrogen atom is contained in a main or side chain thereof, from the point of view that such dispersants can suitably disperse the color material represented by the general formula (I) and the xanthene-based dye and have excellent dispersion stability.

As the dispersant (B) used to disperse the xanthene-based dye, a polymer dispersant composed of a polymer containing a repeating unit having a tertiary amine, or a urethane-based dispersant is preferred, from the point of view that a colorant dispersion liquid can be obtained, which has good dispersibility and realize excellent luminance; which precipitates no aggregates at the time of forming a coating film; and which is able to form a coating film having excellent re-solubility in solvents and excellent heat resistance. The above-mentioned two kinds of dispersants will be described below in detail, which are preferred as the dispersant for the xanthene-based dye.

<Polymer Containing a Repeating Unit Having a Tertiary Amine>

The dispersibility and dispersion stability of the colorant (A) can be increased by using the polymer containing a repeating unit having a tertiary amine, as the dispersant.

The repeating unit having a tertiary amine is a part having an affinity for the colorant (A). Especially, the tertiary amine of the repeating unit and the acidic group of the xanthene-based dye in the colorant (A) cause acid-base interaction therebetween to stabilize. In general, the polymer dispersant composed of the polymer containing the repeating unit having a tertiary amine contains a repeating unit which serves as a part having an affinity for solvents.

As the polymer containing the repeating unit having a tertiary amine, a block copolymer having a block part composed of a repeating unit having a tertiary amine and a block part having solvent affinity, and a graft copolymer containing a repeating unit having a tertiary amine and a repeating unit having a polymer chain that has solvent affinity, are preferably used. In the graft copolymer, the repeating unit having a tertiary amine can be contained in a polymer chain that corresponds to a branch part. The graft copolymer can be a graft copolymer containing a repeating unit having a polymer chain that contains a repeating unit having a tertiary amine and a repeating unit having a polymer chain that has solvent affinity.

The repeating unit having a tertiary amine is needed to have a tertiary amine, and the tertiary amine can be contained in a side chain of a block polymer or can constitute the main chain.

Preferred is a repeating unit having a tertiary amine at a side chain. From the point of view that the main chain skeleton is resistant to thermal decomposition and high heat resistance is obtained, more preferred is a structure represented by the following general formula (III):

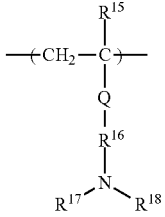

General Formula (III)

wherein $R^{15}$ is a hydrogen atom or a methyl group; Q is a direct bond or a divalent linking group; $R^{16}$ is an alkylene group having 1 to 8 carbon atoms or a divalent organic group represented by $-[CH(R^{20})-CH(R^{21})-O]_x-CH(R^{20})-CH(R^{21})-$ or $-[(CH_2)_y-O]_z-(CH_2)_y-$; each of $R^{17}$ and $R^{18}$ is independently a chain or cyclic hydrocarbon group which can be substituted, or $R^{17}$ and $R^{18}$ are bound to form a cyclic structure; each of $R^{20}$ and $R^{21}$ is independently a hydrogen atom or a methyl group;

"x" is an integer of 1 to 18; "y" is an integer of 1 to 5; and "z" is an integer of 1 to 18.

Examples of the divalent linking group Q of the general formula (III) include an alkylene group having 1 to 10 carbon atoms, an arylene group, a —CONH— group, a —COO— group, an ether group having 1 to 10 carbon atoms (—R'—OR"— wherein each of R' and R" is independently an alkylene group) and combinations thereof. Of them, Q is preferably a —COO— group, from the viewpoint of the heat resistance and solubility in PGMEA of the thus-obtained polymer, and also from the viewpoint of being a relatively inexpensive raw material.

The divalent organic group $R^{16}$ of the general formula (III) is an alkylene group having 1 to 8 carbon atoms, $-[CH(R^{20})-CH(R^{21})-O]_x-CH(R^{20})-CH(R^{21})-$ or $-[(CH_2)_y-O]_z-(CH_2)_y-$. The alkylene group having 1 to 8 carbon atoms can be a straight- or branched-chain alkylene group, and the examples include a methylene group, an ethylene group, a trimethylene group, a propylene group, various kinds of butylene groups, various kinds of pentylene groups, various kinds of hexylene groups and various kinds of octylene groups.

Each of $R^{20}$ and $R^{21}$ is independently a hydrogen atom or a methyl group.

From the viewpoint of dispersibility, $R^{16}$ is preferably an alkylene group having 1 to 8 carbon atoms. $R^{16}$ is more preferably a methylene group, an ethylene group, a propylene group or a butylene group, still more preferably a methylene group or an ethylene group.

In the general formula (III), as the cyclic structure formed by $R^{17}$ and $R^{18}$ bound to each other, for example, there may be mentioned 5-7 membered, nitrogen-containing mono-heterocyclic rings and condensed rings formed by condensation of two of such mono-heterocyclic rings. The nitrogen-containing heterocyclic rings are preferably non-aromatic rings, more preferably saturated rings.

As the repeating unit represented by the general formula (III), there may be mentioned repeating units derived from (meth)acryloyloxypropyldimethylamine, (meth)acryloyloxyethyldimethylamine, (meth)acryloyloxypropyldiethylamine, (meth)acryloyloxyethyldiethylamine, etc. However, the repeating unit represented by the general formula (III) is not limited to them.

(Block Copolymer)

For the block copolymer having the block part composed of the repeating unit having a tertiary amine and the block part having solvent affinity, from the viewpoint of obtaining good solvent affinity and increasing dispersibility, it is preferable to appropriately select the block part having solvent affinity from repeating units derived from non-basic monomers so as to have solvent affinity, depending on the solvent. "Non-basic monomer" as used herein means a polymerizable monomer which gives a solution having a pH lower than 7.1, when the monomer is dissolved at a concentration of 0.1 N in water at 25° C. (when the saturation concentration is less than 0.1 N, at the saturation concentration). As the block part having solvent affinity, for example, there may be mentioned polymers of unsaturated carboxylic acid esters such as polyacrylic acid ester, and polymers of unsaturated carboxylic acids such as polyacrylic acid. From the viewpoint of increasing heat resistance as well as the dispersibility and dispersion stability of the colorant (A), preferred is a polymer having a repeating unit represented by the following general formula (IV):

General Formula (IV)

wherein $R^{22}$ is a hydrogen atom or a methyl group; A is a direct bond or a divalent linking group; $R^{23}$ is an alkyl group having 1 to 18 carbon atoms, an alkenyl group having 2 to 18 carbon atoms, an aralkyl group, an aryl group or a monovalent group represented by $-[CH(R^{24})-CH(R^{25})-O]_x-R^{26}$ or $-[(CH_2)_y-O]_z-R^{26}$; each of $R^{24}$ and $R^{25}$ is independently a hydrogen atom or a methyl group; $R^{26}$ is a hydrogen atom, an alkyl group having 1 to 18 carbon atoms, an alkenyl group having 2 to 18 carbon atoms, an aralkyl group, an aryl group or a monovalent group represented by —CHO, —CH$_2$CHO or —CH$_2$COOR$^{27}$; $R^{27}$ is a hydrogen atom or a straight-chain, branched-chain or cyclic alkyl group having 1 to 5 carbon atoms; "x" is an integer of 1 to 18; "y" is an integer of 1 to 5; "z" is an integer of 1 to 18; "m" is an integer of 3 to 200; and "n" is an integer of 10 to 200.

Preferred concrete examples of such a block copolymer having the block part composed of the repeating unit having a tertiary amine and the block part having solvent affinity include block copolymers mentioned in Japan Patent No. 4911253.

(Graft Copolymer)

In the graft copolymer containing the repeating unit having a tertiary amine and the repeating unit having a polymer chain that has solvent affinity, as the repeating unit having a polymer chain that has solvent affinity, there may be mentioned a repeating unit represented by the following general formula (V), for example:

General Formula (V)

wherein $R^{15'}$ is a hydrogen atom or a methyl group; L is a direct bond or a divalent linking group; and "Polymer" means a polymer chain.

In the general formula (V), L is a direct bond or a divalent linking group. The divalent linking group as L is not particularly limited, as long as it is able to link the ethylenically unsaturated double bond and the polymer chain to each other. Examples of the divalent linking group as L include an alkylene group, an alkylene group having a hydroxyl group, an arylene group, a —CONH— group, a —COO— group, a —NHCOO— group, an ether group (—O— group), a thioether group (—S— group) and combinations thereof. In the present invention, the binding direction of the divalent linking group can be any direction. For example, when —CONH— is contained in the divalent linking group, —CO can be located on the carbon atom side of the main chain and —NH can be located on the polymer chain side of the side chain. To the contrary, —NH can be located on the carbon atom side of the main chain and —CO can be located on the polymer chain side of the side chain.

The polymer chain can be appropriately selected so as to have solubility in the solvent (C).

As an indication, from the viewpoint of obtaining good solvent affinity and increasing dispersibility, it is preferable to select the polymer chain so that the solubility of the graft copolymer in the used solvent (C) is 50 (g/100 g solvent) or more at 23° C.

From the viewpoint of solubility in the solvent, it is preferable that the polymer chain has at least one of repeating units represented by the following general formulae (VI) and (VII):

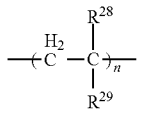

General Formula (VI)

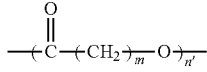

General Formula (VII)

wherein $R^{28}$ is a hydrogen atom or a methyl group; $R^{29}$ is an alkyl group having 1 to 18 carbon atoms, a benzyl group, a phenyl group, a biphenyl group, a cyano group or a monovalent group represented by —[CH($R^{30}$)—CH($R^{31}$)—O]$_x$—$R^{32}$, —[(CH$_2$)$_y$—O]$_z$—$R^{32}$, —[CO—(CH$_2$)$_y$—O]$_z$—$R^{32}$, —CO—O—$R^{33}$ or —O—CO—$R^{34}$; each of $R^{30}$ and $R^{31}$ is independently a hydrogen atom or a methyl group;

$R^{32}$ is a hydrogen atom, an alkyl group having 1 to 18 carbon atoms, a benzyl group, a phenyl group, a biphenyl group or a monovalent group represented by —CHO, —CH$_2$CHO or —CH$_2$COO$R^{35}$; $R^{33}$ is an alkyl group having 1 to 18 carbon atoms, a benzyl group, a phenyl group, a biphenyl group, a cyano group or a monovalent group represented by —[CH($R^{30}$)—CH($R^{31}$)—O]$_x$—$R^{32}$, —[(CH$_2$)$_y$—O]$_z$—$R^{32}$ or —[CO—(CH$_2$)$_y$—O]$_z$—$R^{32}$; $R^{34}$ is an alkyl group having 1 to 18 carbon atoms; $R^{35}$ is a hydrogen atom or an alkyl group having 1 to 5 carbon atoms;

"m" is an integer of 1 to 5; "n" and "n'" are each an integer of 5 to 200; "x" is an integer of 1 to 18; "y" is an integer of 1 to 5; and "z" is an integer of 1 to 18.

Preferred concrete examples of such a graft copolymer containing the repeating unit having a tertiary amine and the repeating unit having the polymer chain that has solvent affinity, include graft copolymers mentioned in Japan patent No. 4911256.

The amine value of the polymer containing the repeating unit having a tertiary amine is not particularly limited. From the viewpoint of obtaining good dispersibility, obtaining excellent heat resistance and increasing re-solubility and alkali developability, the amine value is preferably 60 to 180 mgKOH/g, more preferably 70 to 170 mgKOH/g, still more preferably 80 to 160 mgKOH/g.

The amine value means the number of milligrams (mg) of potassium hydroxide which is equivalent to perchloric acid that is needed to neutralize the amine component contained in each gram of sample. It can be measured by the method defined in JIS-K7237.

In the case of dispersing the xanthene-based dye by using the polymer containing the repeating unit having a tertiary amine as the dispersant, it is preferable that the content of the polymer containing the repeating unit having a tertiary amine is 70 to 300 parts by mass, more preferably 100 to 250 parts by mass, the with respect to 100 parts by mass of the xanthene-based dye. When the content is in the range, excellent dispersibility and dispersion stability can be obtained.

When the color material represented by the general formula (I) is dispersed solely as the colorant (A) or when the color material represented by the general formula (I) and the xanthene-based dye are co-dispersed as the colorant (A), it is preferable to use one in which at least a part of the amino group in the polymer containing the repeating unit having a tertiary amine forms a salt with an organic acid compound (hereinafter such a polymer may be referred to as "salt type polymer") as the dispersant.

By using the salt type polymer, especially, the dispersibility and dispersion stability of the color material represented by the general formula (I) are increased. As the organic acid compound, an acidic organophosphorus compound is preferred from the viewpoint of excellent dispersibility and dispersion stability.

Preferred concrete examples of such a dispersant include salt type block copolymers mentioned in JP-A No. 2012-236882 and salt type graft copolymers mentioned in JP-A No. 2012-63429.

When the colorant containing the color material represented by the general formula (I) is dispersed by using the salt type polymer as the dispersant, the content of the salt type polymer is preferably 10 to 120 parts by mass, more preferably 30 to 80 parts by mass, with respect to 100 parts by mass of the colorant. When the content is in the range, excellent dispersibility and dispersion stability can be obtained.

<Urethane-Based Dispersant>

The urethane-based dispersant which is preferably used as the dispersant for the xanthene-based dye, is a dispersant composed of a compound having one or more urethane bonds (—NH—COO—) per molecule.

Excellent dispersion is possible by using the urethane-based dispersant in a smaller amount than the case of using the polymer containing the repeating unit having a tertiary amine. By making the amount of the dispersant small, the amount of a cure component, etc., can be relatively large. As a result, a color layer with excellent heat resistance can be formed.

In the present invention, the urethane-based dispersant is preferably a reaction product of a polyisocyanate having two or more isocyanate groups per molecule and a polyester having a hydroxyl group at a single terminal or both terminals thereof.

The polyisocyanate preferably has one or more kinds of isocyanate compounds selected from diisocyanates and triisocyanates, and it can be a polymer having a main chain skeleton in which at least one selected from diisocyanates and triisocyanates has been polymerized.

As the main chain structure in which at least one selected from diisocyanates and triisocyanates has been polymerized, there may be mentioned a molecular structure in which isocyanate groups have been bound and polymerized between the molecules of the polyisocyanate. Also, a ring structure such as an aromatic ring which can have a substituent group or a heterocyclic ring, can be contained in the chain architecture of the main chain skeleton.

As the diisocyanate that can be used in the urethane-based dispersant, there may be mentioned aliphatic diisocyanates such as hexamethylene diisocyanate and isophorone diisocyanate. From the viewpoint of heat resistance, preferred are aromatic diisocyanates. For example, there may be mentioned aromatic diisocyanates including: benzene diisocyanates such as benzene-1,3-diisocyanate and benzene-1,4-diisocyanate; toluene diisocyanates such as toluene-2,4-diisocyanate, toluene-2,5-diisocyanate, toluene-2,6-diisocyanate and toluene-3,5-diisocyanate; and xylene diisocyanates such as 1,2-xylene-3,5-diisocyanate, 1,2-xylene-3,6-diisocyanate, 1,2-xylene-4,6-diisocyanate, 1,3-xylene-2,4-diisocyanate, 1,3-xylene-2,5-diisocyanate, 1,3-xylene-2,6-diisocyanate, 1,3-xylene-4,6-diisocyanate, 1,4-xylene-2,5-diisocyanate and 1,4-xylene-2,6-diisocyanate.

As the triisocyanate, for example, there may be mentioned aromatic triisocyanates including: benzene triisocyanates such as benzene-1,2,4-triisocyanate, benzene-1,2,5-triisocyanate and benzene-1,3,5-triisocyanate; toluene triisocyanates such as toluene-2,3,5-triisocyanate, toluene-2,3,6-triisocyanate, toluene-2,4,5-triisocyanate, toluene-2,4,6-triisocyanate, toluene-3,4,6-triisocyanate, and toluene-3,5,6-triisocyanate; and xylene triisocyanates such as 1,2-xylene-3,4,6-triisocyanate, 1,2-xylene-3,5,6-triisocyanate, 1,3-xylene-2,4,5-triisocyanate, 1,3-xylene-2,4,6-triisocyanate, 1,3-xylene-3,4,5-triisocyanate, 1,4-xylene-2,3,5-triisocyanate and 1,4-xylene-2,3,6-triisocyanate. Of them, toluene diisocyanates are preferred from the viewpoint of high heat resistance. These diisocyanates and triisocyanates can be used solely or in combination of two or more kinds. From the viewpoint of high heat resistance, it is particularly preferable to have the main chain structure in which one of the toluene diisocyanates has been polymerized solely.

As the polyester having a hydroxyl group at a single terminal or both terminals thereof, from the viewpoint of dispersibility, preferred is a compound containing a polyester chain represented by $-(O-R^{j}CO)n-$ (wherein $R^{j}$ is an alkylene group having 1 to 20 carbon atoms, and "n" is an integer of 2 or more). Concrete examples of the polyester chain include polylactones such as polycaprolactone, polyvalerolactone and polypropiolactone, and polycondensation type polyesters such as polyethylene terephthalate and polybutylene terephthalate. From the viewpoint of heat resistance, it is preferable to contain polylactones, and it is more preferable to contain polycaprolactone.

From the viewpoint of dispersibility, it is preferable that the urethane-based dispersant has no acidic functional group.

Examples of acidic functional groups include a carboxyl group, a sulfo group and a phosphate group. A typical example is a carboxyl group.

From the viewpoint of dispersibility, in general, the acid value of the pigment dispersant is preferably low, and it is preferably 0 mgKOH/g. This acid value means the acid value per gram of solid content, and it is a value obtained by potentiometric titration according to JIS K 0070.

Also, the amine value is preferably 5 to 180 mgKOH/g, more preferably 10 to 160 mgKOH/g, from the viewpoint of dispersibility.

Also, from the viewpoint of heat resistance, it is preferable that the urethane-based dispersant contains no polyether chain which is easily cut by heating. As used herein, "polyether chain" means a structure represented by $-(O-R^{i})n-$ (wherein $R^{i}$ is an alkylene group having 1 to 10 carbon atoms, and "n" is an integer of 2 or more). Concrete examples thereof include $-(O-CH_2CH_2)n-$, $-(O-CH_2CH_2CH_2)n-$, $-(O-CH_2CH_2CH_2CH_2)n-$, $-(O-CH_2CH_2CH_2CH_2CH_2)n-$ and $-(O-CH_2CH_2CH_2CH_2CH_2CH_2)n-$.

Also, from the viewpoint of heat resistance, electric reliability and dispersibility, the molecular weight of the urethane-based dispersant is preferably in a range of 500 to 30,000, in terms of polystyrene-equivalent mass average molecular weight.

Examples of commercially-available dispersants include Disperbyk-161, 162, 164 and 166 (manufactured by BYK Japan KK), AJISPER PB711 (manufactured by Ajinomoto Co., Inc.) and EFKA-46, 47 and 48 (manufactured by EFKA CHEMICALS). Of them, from the viewpoint of heat resistance, electric reliability and dispersibility, Disperbyk-161, 162 and 166 are preferred.

When the urethane-based dispersant is used to disperse the xanthene-based dye, the content of the urethane-based dispersant is preferably 20 to 150 parts by mass, more preferably 50 to 120 parts by mass, with respect to 100 parts by mass of the xanthene-based dye. When the content is in the range, excellent dispersibility and dispersion stability can be obtained.

As the dispersant (B), these dispersants can be used alone or in combination of two or more kinds. For example, when a dispersion liquid of the color material represented by the general formula (I) and a dispersion liquid of the xanthene-based dye are separately prepared, different dispersants can be each used to disperse each of the color material and the dye.

In the colorant dispersion liquid of the present invention, from the viewpoint of dispersibility and dispersion stability, the content of the dispersant (B) is generally preferably in a range of 1 to 50% by mass, more preferably in a range of 1 to 20% by mass, with respect to the total amount of the dispersion liquid.

[(C) Solvent]

In the present invention, as the solvent (C), a solvent wherein a solubility of the color material represented by the general formula (I) in the solvent and that of the xanthene-based dye in the solvent are each 0.2 (g/100 g solvent) or less at 23° C., is used. By using such a solvent in which the colorant is substantially insoluble or hardly soluble, the colorant (A) of the colorant dispersion liquid of the present invention can be dispersed and used in the form of fine particles in the solvent. From the viewpoint of excellent dispersibility and dispersion stability and obtaining a high-luminance coating film, the solvent (C) used in the present invention is preferably a solvent wherein a solubility of the color material in the solvent and that of the xanthene-based dye in the solvent are each 0.1 (g/100 g solvent) or less at 23° C.

When the solvent (C) is a mixed solvent containing two or more kinds of solvents, it is needed that the solubility of the color material represented by the general formula (I) in the mixed solvent and that of the xanthene-based dye in the mixed solvent are each 0.2 (g/100 g solvent) or less at 23° C.

In the present invention, the solvent wherein the solubility of the color material in the solvent and that of the xanthene-based dye in the solvent are each 0.2 (g/100 g solvent) or less at 23° C., can be simply determined by the following evaluation method.

First, by the following method, it can be determined whether or not the solvent is a solvent in which the color material or the xanthene-based dye is substantially insoluble.

First, 0.1 g of a colorant to be evaluated for its solubility is put in a 20 mL sample tube. A solvent S is put in the tube by means of a 10 ml whole pipette. The tube is capped and then subjected to an ultrasonic treatment for 3 minutes. The thus-obtained solution is left to stand and stored in a water bath at 23° C. for 60 minutes. Then, 5 ml of the supernatant is filtered with a 5 μm PTFE membrane filter and then with a 0.25 μm membrane filter to remove insoluble substances. The thus-obtained filtrate is measured for absorption spectrum, using a 1 cm cell in an ultraviolet and visible spectrophotometer (such as UV-2500PC manufactured by Shimadzu Corporation). The absorbance (abs) of each colorant at the maximum absorption wavelength is obtained. At this time, if the absorbance (abs) is less than 40% of the measurement upper limit value (in the case of UV-2500PC manufactured by Shimadzu Corporation, the absorbance (abs) is less than 2), it can be evaluated that the solvent is a solvent in which the colorant is substantially insoluble. At this time, when the absorbance (abs) is 40% or more of the measurement upper limit value, the solubility is further obtained by the following evaluation method.

First, a filtrate is obtained in the same manner as above by using, instead of the solvent S, a good solvent for a colorant to be evaluated for its solubility (e.g., alcohol such as methanol) and a colorant solution is produced. Then, the solution is appropriately diluted about 10,000- to 100,000-fold, and the absorbance of the colorant at the maximum absorption wavelength is measured in the same manner as above. The solubility of the colorant in the solvent S is calculated from the absorbance and dilution rate of the solution of the colorant in the solvent S and those of the solution of the colorant in the good solvent.

As a result, the solvent wherein the solubility of the color material in the solvent and that of the xanthene-based dye in the solvent are each 0.2 (g/100 g solvent) or less, is determined as a solvent in which the colorant is hardly soluble and which can be used in the present invention.

In the colorant dispersion liquid of the present invention, from the viewpoint of dispersion stability, it is preferable to appropriately select the solvent (C) from ester-based solvents.

Preferred examples of ester-based solvents wherein a solubility of the color material in the solvents and that of the xanthene-based dye in the solvents are each 0.2 (g/100 g solvent) or less, include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate.

Of them, it is preferable to use propylene glycol monomethyl ether acetate (PGMEA), from the point of view that it has a low risk to the human body and has fast heat-drying properties although it has low volatility at around room temperature. In this case, there is such an advantage that a special washing step is not needed when switching from a conventional color resin composition using PGMEA.

These solvents can be used alone or in combination of two or more kinds.

The content of the solvent wherein the solubility of the color material in the solvent and that of the xanthene-based dye in the solvent are each 0.2 (g/100 g solvent) or less at 23° C., is preferably 70% by mass or more of the total amount of the solvent used in the present invention, more preferably 80% by mass or more, still more preferably 90% by mass or more, particularly preferably 100% by mass.

The content of the propylene glycol monomethyl ether acetate is preferably 50% by mass or more of the total amount of the solvent used in the present invention, more preferably 70% by mass or more, still more preferably 90% by mass or more, and particularly preferably 100% by mass.

Also, solvents wherein a solubility of the colorant in the solvents is more than 0.2 (g/100 g solvent) can be appropriately used in combination, as long as the effects of the present invention are not impaired. In the case of combining such solvents wherein the solubility of the colorant is high, the content rate of the solvents with such high solubility can be appropriately adjusted in a range in which the solubility of the color material represented by the general formula (I) in the mixed solvent containing the solvents with such high solubility and that of the xanthene-based dye in the mixed solvent, become each 0.2 (g/100 g solvent) or less at 23° C. The allowable content rate of the solvents wherein the solubility of the colorant is high, varies depending on the type of the colorant or solvents. As an indication, it can be 30% by mass or less of the total amount of the solvent, and it is preferably 20% by mass or less, more preferably 10% by mass or less.

The colorant dispersion liquid of the present invention is prepared by using the solvent generally at a ratio of 50 to 95% by mass, preferably 60 to 85% by mass, with respect to the total amount of the colorant dispersion liquid. As the solvent amount decreases, the viscosity increases and the dispersibility decreases. As the solvent amount increases, the colorant concentration decreases, possibly resulting in a difficulty in achieving a target chromaticity coordinate after preparation of the color resin composition for color filters.

(Other Components)

The colorant dispersion liquid of the present invention can further contain a dispersion assisting resin and other components as needed, as long as the effects of the present invention are not impaired.

As the dispersion assisting resin, there may be mentioned an alkali soluble resin for example, which will be mentioned below under "Color resin composition for color filters". The particles of the colorant becomes less likely to contact with each other due to steric hindrance by the alkali soluble resin, resulting in stabilization of particle dispersion, and the particle dispersion stabilization effect may be effective in reducing the dispersant.

Other components include a surfactant, which is used to increase wettability, a silane coupling agent, which is used to increase adhesion properties, a defoaming agent, a cissing inhibitor, an antioxidant, an aggregation inhibitor and an ultraviolet absorber, for example.

The colorant dispersion liquid of the present invention is used as a preliminarily prepared product for preparing the below-described color resin composition for color filters. That is, the colorant dispersion liquid is a colorant dispersion liquid which is preliminarily prepared at a stage prior to preparing the below-described color resin composition and whose "the mass of the colorant component in the composition"/"the mass of the solid content other than the colorant component in the composition" ratio is high. In particular, this ratio (i.e., "the mass of the colorant component in the composition"/"the mass of the solid content other than the colorant component in the composition" ratio) is generally 1.0 or more. By mixing the colorant dispersion liquid with at least a binder component, a color resin composition with excellent dispersibility can be prepared.

[Method for Producing a Colorant Dispersion Liquid]

In the present invention, the method for producing a colorant dispersion liquid is not particularly limited, as long as it is a method that can produce a colorant dispersion liquid in which the color material represented by the general formula (I) and the xanthene-based dye are dispersed in the solvent by the dispersant. For example, there may be mentioned (a) a method in which a dispersion liquid of the color material represented by the general formula (I) and a dispersion liquid of the xanthene-based dye are separately prepared and then mixed together to prepare the colorant dispersion liquid of the present invention, and (b) a method in which the color material represented by the general formula (I), the xanthene-based dye and the dispersant (B) are added to the solvent and the color material and the xanthene-based dye are co-dispersed to prepare the colorant dispersion liquid of the present invention.

In the method (a), the dispersion liquid can be prepared by the following method: the dispersant (B) is mixed with the solvent (C) and stirred to produce a dispersant solution; the dispersant solution is mixed with the color material represented by the general formula (I) or the xanthene-based dye and, as needed, other component; the mixture is dispersed with a known stirrer or disperser, thereby preparing the dispersion liquid.

The dispersion liquid of each colorant can be prepared as follows: the color material represented by the general formula (I) or the xanthene-based dye, the dispersant (B), the solvent (C) and a small amount of good solvent for the colorant are mixed; the mixture is subjected to dispersion treatment with a known stirrer or disperser; after a reaction is completed, the good solvent for the colorant is removed, thereby producing the dispersion liquid.

When the sulfonic acid salt of the xanthene-based dye having a sulfonic acid salt is changed into a sulfo group at the time of preparing the colorant dispersion liquid, the preparation method is not particularly limited. For example, there may be mentioned the following method.

The xanthene-based dye having a sulfonic acid salt is dissolved in a good solvent for the xanthene-based dye, such as methanol or ethanol, and an acid such as concentrated hydrochloric acid is added. To the solution, the solvent (C) such as propylene glycol monomethyl ether acetate (PGMEA) and the dispersant (B) are added. After heating the solution, the good solvent for the colorant, such as methanol, is removed by reduced-pressure distillation, etc. In addition, precipitates are removed by filtration to obtain a filtrate, thereby preparing the colorant dispersion liquid of the present invention.

As the disperser for dispersion treatment, there may be mentioned roller mills such as a two-roller mill and a three-roller mill, ball mills such as a vibrating ball mill, paint conditioners, bead mills such as a continuous disk type bead mill and a continuous annular type bead mill, for example. In the case of using a bead mill, a preferred dispersion condition is that the diameter of beads is 0.03 to 2.00 mm, more preferably 0.10 to 1.0 mm.

In particular, a preparatory dispersion is performed with 2 mm zirconia beads, which is a relatively large bead diameter, and then a main dispersion is further performed with 0.1 mm zirconia beads, which is a relatively small bead diameter. It is preferable to perform filtration with a 0.5 to 0.1 μm membrane filter after the dispersion treatment.

In the present invention, from the viewpoint of excellent dispersibility, it is preferable to prepare the colorant dispersion liquid by the above method (b).

That is, the method for producing a colorant dispersion liquid according to the present invention contains (A) a colorant, (B) a dispersant, and (C) a solvent, wherein the colorant (A) contains a color material represented by the general formula (I) and a xanthene-based dye, and a solubility of the color material in the solvent (C) and that of the xanthene-based dye in the solvent (C) are each 0.2 (g/100 g solvent) or less at 23° C., wherein the method has a step of adding the color material, the xanthene-based dye and the dispersant (B) to the solvent (C) and co-dispersing the color material and the xanthene-based dye.

According to the above method for producing the colorant dispersion liquid of the present invention, when the color material represented by the general formula (I) and the xanthene-based dye are co-dispersed, the cation of the color material is surface-modified with the xanthene-based dye by n-n interaction, electrical interaction or acid-base interaction, thereby promoting the dispersion in the state where the color material represented by the general formula (I) and the xanthene-based dye are combined. Therefore, it is presumed that increased dispersibility is obtained, as well as excellent heat resistance and light resistance.

According to the method for producing the colorant dispersion liquid of the present invention, the colorant can be dispersed well, without changing the sulfonic acid salt of the xanthene-based dye having a sulfonic acid salt into a sulfo group.

The components used in the method for producing the colorant dispersion liquid of the present invention will not be described here, since they are the same as those of the above-described colorant dispersant. The method for preparing the co-dispersion liquid can be the same as the above-described method for preparing the dispersion liquid.

The colorant dispersion liquid is obtained in the manner described above, in which the fine colorant particles have excellent dispersibility. The colorant dispersion liquid is used as a pre-prepared product for preparing the color resin composition for color filters, which has excellent colorant dispersibility.

[Color Resin Composition for Color Filters]

The color resin composition for color filters according to the present invention contains (A) a colorant, (B) a dispersant, (C) a solvent and (D) a binder component, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

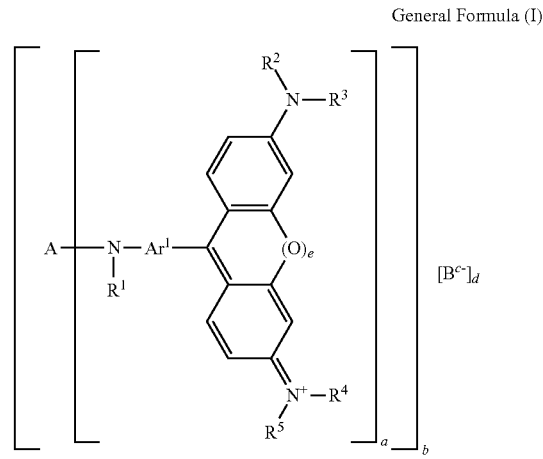

General Formula (I)

wherein the symbols shown in the general formula (I) are as described above.

The color resin composition for color filters of the present invention can form a high-luminance color layer with excellent heat resistance, because the above-specified colorant (A) is dispersed in the solvent (C) by the dispersant (B).

The color resin composition for color filters of the present invention contains the colorant (A), the dispersant (B), the solvent (C) and the binder component (D), and it can contain other components as needed, as long as the effects of the present invention are not impaired.

Hereinafter, the color resin composition for color filters of the present invention will be described. However, the colorant (A), the dispersant (B) and the solvent (C) will not be described below, since they can be the same as those of the above-described colorant dispersion liquid of the present invention.

<(D) Binder Component>

To provide film-forming and surface adhesion properties, the color resin composition for color filters of the present invention contains a binder component. To provide sufficient hardness to coating films, it is preferable that a curable binder component is contained in the color resin composition for color filters of the present invention. The curable binder component is not particularly limited, and conventionally-known curable binder components that are used to form color layers of color filters can be appropriately used.

The curable binder component includes a photocurable binder component containing a photocurable resin, the resin being polymerizable and curable by visible light, ultraviolet or electron beam radiation, etc., and a thermosetting binder component containing a thermosetting resin, the resin being polymerizable and curable by heating.

No developing properties are required of the curable binder component, when it is possible to form color layers by attaching the color resin composition of the present invention selectively in a pattern onto a substrate, such as the ink-jet method. In this case, there may be used a known thermosetting binder component or photosensitive binder component, appropriately, which are used to form color layers of color filters by the ink-jet method, etc.

As the thermosetting binder, a combination of a compound having two or more thermosetting functional groups per molecule and a curing agent is generally used. In addition, a catalyst which can promote a thermosetting reaction can be added. Examples of thermosetting functional groups include an epoxy group, an oxetanyl group, an isocyanate group and an ethylenically unsaturated bond. As the thermosetting functional groups, epoxy groups are preferably used. Concrete examples of the thermosetting binder component include those mentioned in International Publication No. WO2012/144521.

On the other hand, in the case of using a photolithography process to form color layers, a photosensitive binder component with alkali developability is suitably used.

Hereinafter, photosensitive binder components will be explained. However, the curable binder component used in the present invention is not limited to them. Besides the below-described photosensitive binder components, a thermosetting binder component that is polymerizable and curable by heating, such as epoxy resin, can be further used.

Photosensitive binder components include a positive photosensitive binder component and a negative photosensitive binder component. Examples of positive photosensitive binder components include those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition for color filters of the present invention, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

(Alkali Soluble Resin)

In the present invention, the alkali soluble resin can be appropriately selected, as long as it has a carboxyl group, functions as a binder resin, and is soluble in developing solutions used for pattern formation, particularly preferably in an alkali developing solution.

The alkali soluble resin preferred in the present invention is a resin having a carboxyl group. Concrete examples thereof include acrylic copolymers having a carboxyl group and epoxy (meth)acrylate resins having a carboxyl group. Of them, particularly preferred is one having a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group can further contain a constitutional unit having an aromatic carbon ring. The aromatic carbon ring functions as a component which imparts coatability to the color resin composition for color filters.

The acrylic copolymer having a carboxyl group can further contain a constitutional unit having an ester group. The constitutional unit having an ester group not only functions as a component which inhibits alkali solubility of the color resin composition for color filters, but also functions as a component which increases solubility in solvents and re-solubility in solvents.

Concrete examples of the acrylic copolymer having a carboxyl group include those described in International Publication No. WO2012/144521. In particular, there may be mentioned copolymers obtained from a monomer having no carboxyl group, such as methyl (meth)acrylate and ethyl (meth)acrylate, with one or more selected from (meth)acrylic acid and anhydrides thereof. Also, there may be mentioned polymers obtained by introducing an ethylenically unsaturated bond in the above copolymers by, for example, addition of an ethylenically unsaturated compound having a reactive functional group such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure, and stable color filters can be obtained.

The copolymerization ratio of the carboxyl group-containing ethylenically unsaturated monomer in the carboxyl group-containing copolymer is generally 5 to 50% by mass, preferably 10 to 40% by mass. When the copolymerization ratio of the carboxyl group-containing ethylenically unsaturated monomer is less than 5% by mass, the solubility of the coating film thus obtained in alkali developing solutions is decreased, resulting in a difficulty with pattern formation. When the copolymerization ratio exceeds 50% by mass, upon development with an alkali developing solution, a pattern thus formed is likely to come off of the substrate or roughening of pattern surface is likely to occur.

The molecular weight of the carboxyl group-containing copolymer is preferably in a range of 1,000 to 500,000, more preferably in a range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy (meth)acrylate resin having a carboxyl group is not particularly limited. As the resin, however, an epoxy (meth)acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. Concrete examples thereof include those described in International Publication No. WO2012/144521. As each of the epoxy compound, the unsaturated group-containing monocarboxylic acid, and the acid anhydride, those mentioned above can be used alone or in combination of two or more kinds.

As the unsaturated group-containing monocarboxylic acid, for example, there may be mentioned (meth)acrylic acid, 2-(meth)acryloyloxyethyl succinic acid, 2-(meth)acryloyloxyethyl phthalic acid, (meth)acryloyloxyethyl hexahydrophtalic acid, (meth)acrylic acid dimer, β-furfuryl acrylic acid, β-styryl acrylic acid, cinnamic acid, crotonic acid and α-cyano cinnamic acid. These unsaturated group-containing monocarboxylic acids can be used alone or in combination of two or more kinds.

As the acid anhydride, there may be mentioned the following: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylene tetrahydrophthalic anhydride, methylendomethylene tetrahydrophthalic anhydride, chlorendic anhydride, methyltetrahydrophthalic anhydride; aromatic polycarboxylic acid anhydrides such as trimellitic anhydride, pyromellitic dianhydride, benzophenonetetracarboxylic dianhydride, biphenyltetracarboxylic dianhydride, biphenyl ether tetracarboxylic acid; and polycarboxylic acid anhydride derivatives such as 5-(2,5-dioxotetrahydrofuryl)-3-methyl-3-cyclohexene-1,2-dicarboxylic anhydride and endobicyclo-[2,2,1]-hepto-5-ene-2,3-dicarboxylic anhydride. They can be used alone or in combination of two or more kinds.

The molecular weight of the carboxyl group-containing epoxy (meth)acrylate compound obtained as above, is not particularly limited. However, it is preferably 1,000 to 40,000 more preferably 2,000 to 5,000.

The alkali soluble resin used in the color resin composition for color filters of the present invention, can be one kind of alkali soluble resin or a combination of two or more kinds of alkali soluble resins. The content of the alkali soluble resin is generally in a range of 10 to 1,000 parts by mass, preferably in a range of 20 to 500 parts by mass, with respect to 100 parts by mass of the colorant contained in the color resin composition. When the content of the alkali soluble resin is too small, sufficient alkali developability may not be obtained. When the content is too large, the ratio of the colorant is relatively small, so that sufficient color density may not be obtained.

(Polyfunctional Monomer)

The polyfunctional monomer used in the color resin composition for color filters of the present invention, is not particularly limited, as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Such a polyfunctional (meth)acrylate can be appropriately selected from conventionally known ones. Concrete examples thereof include those mentioned in International Publication No. WO2012/144521.

These polyfunctional (meth)acrylates can be used alone or in combination of two or more kinds. When excellent photocurability (high sensitivity) is required of the color resin composition the present invention, the polyfunctional monomer is preferably one having three or more polymerizable double bonds (trifunctional). Preferred are poly(meth) acrylates of trivalent or higher polyalcohols and dicarboxylic acid-modified products thereof. Concrete examples thereof include succinic acid-modified products of trimethylolpropane tri(meth)acrylate, pentaerythritol tri(meth)acrylate and pentaerythritol tri(meth)acrylate, succinic acid-modified products of pentaerythritol tetra(meth)acrylate, dipentaerythritol tetra(meth)acrylate, dipentaerythritol penta(meth)acrylate and dipentaerythritol penta(meth)acrylate, and dipentaerythritol hexa(meth)acrylate.

The content of the polyfunctional monomer used in the color resin composition for color filters of the present invention, is not particularly limited. However, it is generally about 5 to 500 parts by mass, preferably in a range of 20 to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

(Photoinitiator)

The photoinitiator used in the color resin composition for color filters of the present invention, is not particularly limited. As the photoinitiator, conventionally-known various kinds of photoinitiators can be used alone or in combination of two or more kinds. Concrete examples thereof include those mentioned in International Publication No. WO2012/144521.

The content of the photoinitiator used in the color resin composition of the present invention, is generally about 0.01 to 100 parts by mass, preferably 5 to 60 parts by mass, with respect to 100 parts by mass of the polyfunctional monomer. When the content is smaller than the range, sufficient polymerization reaction may not be caused, so that the hardness of color layers may not be sufficient. When the content is larger than the range, the content of the colorant and so on in the solid content of the color resin composition is relatively small, so that sufficient color density may not be obtained.

<Optionally-Added Compounds>

As needed, the color resin composition of the present invention can further contain other colorant or various kinds of additives, as long as there is no deterioration in the object of the present invention.

(Other Colorant)

Other colorant can be added as needed, in order to control color tone. For example, it can be selected from conventionally-known pigments and dyes, according to the purpose, and such pigments and dyes can be used alone or in combination of two or more kinds.

Concrete examples of the other colorant include pigments such as C. I. Pigment Violet 1, C. I. Pigment Violet 19, C. I. Pigment Violet 23, C. I. Pigment Violet 29, C. I. Pigment Violet 32, C. I. Pigment Violet 36, C. I. Pigment Violet 38, C. I. Pigment Blue 1, C. I. Pigment Blue 15, C. I. Pigment Blue 15:3, C. I. Pigment Blue 15:4, C. I. Pigment Blue 15:6, C. I. Pigment Blue 60, C. I. Pigment Red 82, C. I. Pigment Violet 1, C. I. Pigment Violet 2, and C. I. Pigment Violet 3, and dyes such as Acid Red.

In the case of using the other colorant, the content is not particularly limited, as long as the effects of the present invention are not impaired. The content of the other colorant is preferably 40 parts by mass or less, more preferably 20 parts by mass or less, with respect to 100 parts by mass of the total amount of the colorant (A). This is because when the content is in this range, color tone can be controlled without impairing the properties of the color material represented by the general formula (I) and the xanthene-based dye, such as high transmittance, heat resistance and light resistance.

(Antioxidant)

From the viewpoint of heat resistance, it is preferable that the color resin composition of the present invention further contains an antioxidant. The antioxidant can be appropriately selected from conventionally-known ones. Concrete examples of the antioxidant include a hindered phenol-based antioxidant, an amine-based antioxidant, a phosphorus-based antioxidant, a sulfur-based antioxidant and a hydrazine-based antioxidant. From the viewpoint of heat resistance, it is preferable to use a hindered phenol-based antioxidant.

In the case of using the antioxidant, the amount is not particularly limited, as long as it is in a range that does not impair the effects of the present invention. The amount of the antioxidant used is preferably 0.1 to 5.0 parts by mass, more preferably 0.5 to 4.0 parts by mass, with respect to the total solid content 100 parts by mass of the color resin composition. When the amount of the antioxidant used is equal to or more than the lower limit, excellent heat resistance is obtained. When the amount is equal to or less than the upper limit, the color resin composition of the present invention can be a highly-sensitive photosensitive resin composition.

(Other Additives)

Examples of additives include, besides the above-mentioned antioxidant, a polymerization terminator, a chain transfer agent, a leveling agent, a plasticizer, a surfactant, a defoaming agent, a silane coupling agent, an ultraviolet absorber and an adhesion enhancing agent.

Concrete examples of the surfactant and the plasticizer include those mentioned in International Publication No. WO2012/144521.

<The Content of Each Component in the Color Resin Composition>

The total content of the colorant (A) is preferably 3 to 65% by mass, more preferably 4 to 55% by mass, with respect to the total solid content of the color resin composition. When the total content is equal to or more than the lower limit, the color layer obtained by applying the color resin composition for color filters to achieve a predetermined thickness (generally 1.0 to 5.0 µm) has sufficient color density. When the total content is equal to or less than the upper limit, a color layer with excellent dispersibility and dispersion stability and with sufficient hardness and adhesion to the substrate can be obtained. In the present invention, "solid content" includes all the above-described components other than the solvent, and it also includes the polyfunctional monomer in a liquid form.

Also, the content of the dispersant (B) is not particularly limited, as long as it is able to homogeneously disperse the colorant (A). For example, the dispersant content is 3 to 40 parts by mass, with respect to 100 parts by mass of the solid content of the color resin composition. More preferably, the content is 5 to 35 parts by mass, particularly preferably 5 to 25 parts by mass, with respect to 100 parts by mass of the solid content of the color resin composition. When the content is equal to or more than the lower limit, the colorant (A) has excellent dispersibility and dispersion stability, and it has excellent storage stability. When the content is equal to or less than the upper limit, excellent developing properties can be obtained.

The total amount of the binder component (D) is 10 to 92% by mass, preferably 15 to 87% by mass, with respect to the total solid content of the color resin composition. When the total amount is equal to or more than the lower limit, a color layer with sufficient hardness and adhesion to the substrate can be obtained. When the total amount is equal to or less than the upper limit, excellent developing properties can be obtained, and generation of fine wrinkles can be inhibited, which is due to heat shrinkage.

The content of the solvent (C) can be appropriately determined in a range which can form a color layer with accuracy. In general, the content is preferably in a range of 55 to 95% by mass, particularly preferably in a range of 65 to 88% by mass, with respect to the total amount of the color resin composition including the solvent. When the content of the solvent is in the range, excellent coatability can be provided to the color resin composition.

<Method for Producing the Color Resin Composition for Color Filters>

The method for producing the color resin composition for color filters of the present invention is not particularly limited, as long as it is a method in which the colorant (A), the dispersant (B), the solvent (C), the binder component (D) and various kinds of additional components that are added as needed are contained, and the colorant (A) can be homogeneously dispersed in the solvent (C) by the dispersant (B). The color resin composition can be prepared by mixing them using a known mixing means.

Examples of the method for preparing the color resin composition include the following: (1) a method of mixing the colorant dispersion liquid of the present invention with the binder component (D) and various kinds of additional components used as needed; (2) a method of mixing the dispersion liquid of the color material represented by the general formula (I), the dispersion liquid of the xanthene-based dye, the binder component (D) and various kinds of additional components used as needed; (3) a method of adding the colorant (A), the dispersant (B), the binder component (D) and various kinds of additional components used as needed to the solvent (C) at the same time and mixing them; and (4) a method of adding the dispersant (B), the binder component (D) and various kinds of additional components used as needed to the solvent (C), mixing them, adding the colorant (A) thereto and then mixing them.

Of these methods, the method (1) or (2) is preferred, from the viewpoint of effectively preventing the aggregation of the colorant and homogeneously dispersing the colorant.

[Color Filter]

The color filter of the present invention contains at least a transparent substrate and color layers disposed on the substrate, and at least one of the color layers is a color layer which is a cured product of the color resin composition of the present invention.

Such a color filter of the present invention will be explained, with reference to figures. FIG. 1 is a schematic cross-sectional view showing an example of the color filter of the present invention. FIG. 1 shows that a color filter 10 of the present invention contains a transparent substrate 1, a light shielding part 2 and a color layer 3.

(Color Layer)

At least one of the color layers used in the color filter of the present invention is a cured product of the above-described color resin composition for color filters of the present invention.

It is generally formed on an opening of the light shielding part on the below-described transparent substrate and is generally composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layer is appropriately controlled by controlling the applying method, solid content concentration, viscosity, etc., of the color resin composition. In general, the thickness is preferably in a range of 1 to 5 μm.

For example, when the color resin composition is a photosensitive resin composition, the color layer can be formed by the following method.

First, the above-described color resin composition for color filters of the present invention is applied onto the below-described transparent substrate by a coating method such as a spray coating method, a dip coating method, a bar coating method, a roll coating method or a spin coating method to form a wet coating film.

Then, the wet coating film is dried with a hot plate or oven. The dried film is subjected to exposure through a mask with a given pattern to cause a photopolymerization reaction of the alkali soluble resin, the polyfunctional monomer, etc., thereby obtaining a photosensitive coating film. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

The film can be heated to promote polymerization reaction after the exposure. The heating condition is appropriately determined, depending on the content ratio of the components used in the color resin composition of the present invention, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent, is generally used. An appropriate amount of surfactant, etc., can be added to the alkali solution. The developing method can be selected from general developing methods.

After the developing treatment, generally, the developing solution is rinsed off, followed by drying of the cured coating film of the color resin composition, thereby forming a color layer. A heating treatment can be performed after the developing treatment to sufficiently cure the coating film. The heating condition is not particularly limited and is appropriately determined depending on the intended use of the coating film.

(Light Shielding Part)

In the color filter of the present invention, the light shielding part is formed in pattern on the below-described transparent substrate and can be the same as those which are used in general color filters.

The pattern shape of the light shielding part is not particularly limited, and examples thereof include a stripe-shaped pattern, a matrix-shaped pattern, etc. As the light shielding part, for example, there may be mentioned one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or can be a stack of three layers of one $CrO_x$ layer (x is an arbitrary number), one $CrN_y$ layer (y is an arbitrary number) and one Cr layer, the stack of three layers having a further reduced reflectance.

When the light shielding part is one produced by dispersing or dissolving a black colorant in a binder resin, the method for producing the light shielding part is not particularly limited and is only required to be a method which can pattern the light shielding part. For example, there may be mentioned a photolithography method using the color resin composition for the light shielding part, a printing method using the same, an ink-jet method using the same, etc.

When the light shielding part is a thin metal layer, the thickness is about 0.2 to 0.4 μm. When the light shielding part is formed from the black colorant dispersed or dissolved in the binder resin, the thickness is about 0.5 to 2 μm.

(Transparent Substrate)

The transparent substrate of the color filter of the present invention is not particularly limited, as long as it is a substrate transparent to visible light. It can be selected from general transparent substrates used in color filters. Concrete examples thereof include inflexible transparent rigid materials such as silica glass plate, non-alkali glass plate and synthetic silica plate, and transparent flexible materials with flexibility and flexible properties such as transparent resin film, optical resin plate and flexible glass.

The thickness of the transparent substrate is not particularly limited. However, depending on the intended use of the color filter of the present invention, one having a thickness of about 100 μm to 1 mm can be used, for example.

In addition to the transparent substrate, the light shielding part and the color layer, the color filter of the present invention can also contain an overcoat layer and a transparent electrode layer, for example. Moreover, an orientation layer and a columnar spacer can be formed in the color layer.

[Liquid Crystal Display Device]

The liquid crystal display device of the present invention contains the above-described color filter of the present invention, a counter substrate, and a liquid crystal layer disposed between the color filter and the counter substrate.

Figure 2:
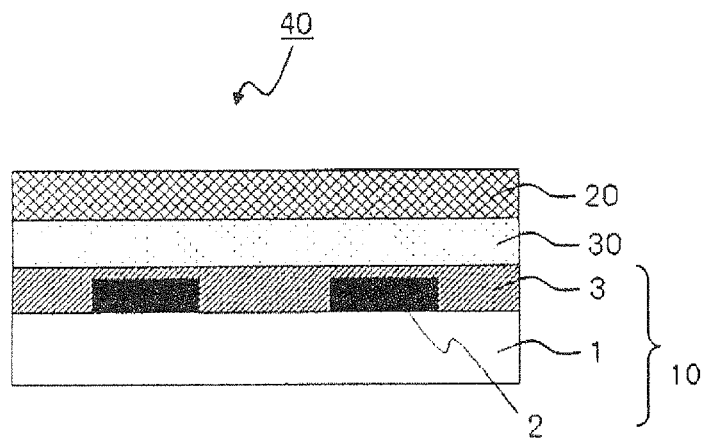
FIG. 2 is a schematic view showing an example of the liquid crystal display device of the present invention.

Such a liquid crystal display device of the present invention will be explained with reference to figures. FIG. 2 is a schematic view showing an example of the liquid crystal display device of the present invention. As shown in FIG. 2, the liquid crystal display device of the present invention, liquid crystal display device 40, contains a color filter 10, a counter substrate 20 containing a TFT array substrate, etc., and a liquid crystal layer 30 formed between the color filter 10 and the counter substrate 20.

The liquid crystal display device of the present invention is not limited to the configuration shown in this FIG. 2. It can be a configuration which is generally known as a liquid crystal display device containing a color filter.

The method for driving the liquid crystal display device of the present invention is not particularly limited and can be selected from driving methods which are generally used in liquid crystal display devices. Examples of such driving methods include a TN method, an IPS method, an OCB method and an MVA method. In the present invention, any of these methods can be suitably used.

The counter substrate can be appropriately selected depending on the driving method, etc., of the liquid crystal display device of the present invention.

Also, the liquid crystal constituting the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer; then, the encapsulated liquid crystal can be oriented by gradually cooling the liquid crystal cell to room temperature.

In the liquid crystal dripping method, for example, a sealing agent is applied to the periphery of the color filter; the color filter is heated to the temperature at which the liquid crystal is in an isotropic phase; the liquid crystal is dripped with a dispenser or the like, in the form of isotropic liquid; the color filter and the counter substrate are stacked under reduced pressure and attached to each other via the applied sealing agent, thereby forming a liquid crystal layer; then, the encapsulated liquid crystal can be oriented by gradually cooling the liquid crystal cell to room temperature.

[Organic Light-Emitting Display Device]

The organic light-emitting display device of the present invention contains the above-described color filter of the present invention and an organic light-emitting material.

Figure 3:
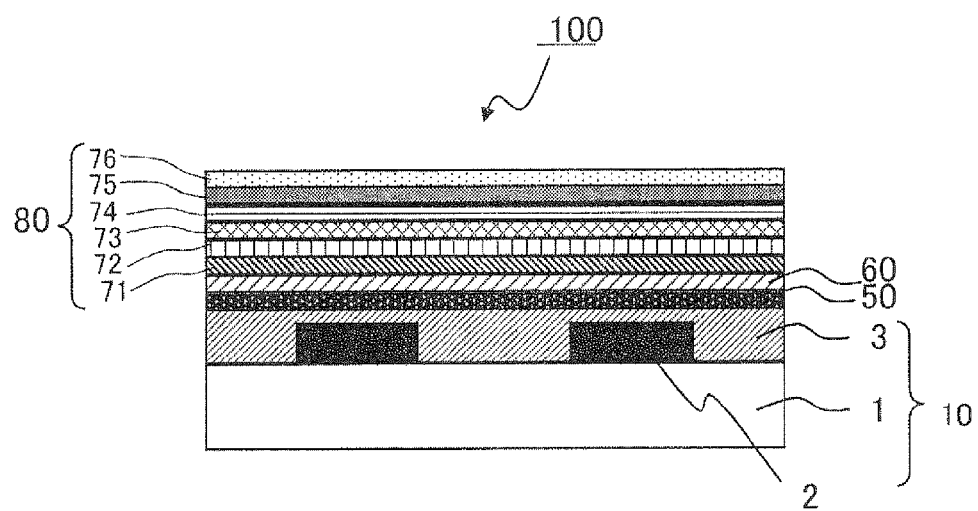
FIG. 3 is a schematic view showing an example of the organic light-emitting display device of the present invention.

Such an organic light-emitting display device of the present invention will be explained with reference to figures. FIG. 3 is a schematic view showing an example of the organic light-emitting display device of the present invention. As shown in FIG. 3, the organic light-emitting display device of the present invention, organic light-emitting display device 100, contains a color filter 10 and an organic light-emitting material 80. An organic protection layer 50 and/or an inorganic oxide layer 60 can be disposed between the color filter 10 and the organic light-emitting material 80.

As the method for stacking the components of the organic light-emitting material 80, for example, there may be mentioned a method of stacking on the color filter a transparent positive electrode 71, a positive hole injection layer 72, a positive hole transport layer 73, a light-emitting layer 74, an electron injection layer 75 and a negative electrode 76 in this sequence, a method of attaching the organic light-emitting material 80 formed on a different substrate onto the inorganic oxide layer 60. In the organic light-emitting material 80, the transparent positive electrode 71, the positive hole injection layer 72, the positive hole transport layer 73, the light-emitting layer 74, the electron injection layer 75, the negative electrode 76 and other components can be selected from conventionally-known materials and used. The organic light-emitting display device 100 produced as above is applicable to passive or active drive organic EL displays, for example.

The organic light-emitting display device of the present invention is not limited to the configuration shown in FIG. 3. It can have any one of configurations which are generally known as those of organic light-emitting display devices containing a color filter.

EXAMPLES

Hereinafter, the present invention will be described in detail, by way of examples. The present invention is not limited by these examples.

The average dispersed particle size of particles contained in each dispersion liquid was obtained by appropriately diluting each dispersion liquid about 100- to 1,000-fold with PGMEA, measuring the particle size distribution at 23° C. by a dynamic light scattering method using a laser scattering particle size distribution analyzer (nanotrac particle size analyzer "UPA-EX150" manufactured by Nikkiso Co., Ltd.), and converting the 50% average particle size into volume (MV). In a dye dispersion liquid, the particle size is presumed to be the average dispersed particle size of micelles of a dye and a dispersant.

Production Example 1

Production of Color Material (1) Synthesis of Intermediate 1

First, 15.2 g (60 mmol) of 1-iodonaphthalene (manufactured by Wako Pure Chemical Industries, Ltd.), 4.63 g (30 mmol) of norbornane diamine (NBDA) (CAS No. 56602-77-8) (manufactured by Mitsui Chemicals, Inc.), 8.07 g (84 mmol) of sodium-tert-butoxide, 0.09 g (0.2 mmol) of 2-dicyclohexylphosphino-2',6',-dimethoxybiphenyl (manufactured by Aldrich) and 0.021 g (0.1 mmol) of palladium acetate (manufactured by Wako Pure Chemical Industries, Ltd.) were dispersed in 30 mL of xylene and reacted at 130 to 135° C. for 48 hours. After a reaction was completed, the resultant was cooled to room temperature, mixed with water and extracted. Then, the resultant was dried and condensed with magnesium sulfate, thereby obtaining 8.5 g of the intermediate 1 represented by the following chemical formula (1) (yield 70%).

From the following analysis results, the obtained compound was confirmed to be a desired compound.

MS(ESI) (m/z): 407 (M+H)

Values of elemental analysis: CHN actual measurement values (85.47%, 8.02%, 6.72%); theoretical values (85.26%, 8.11%, 6.63%)

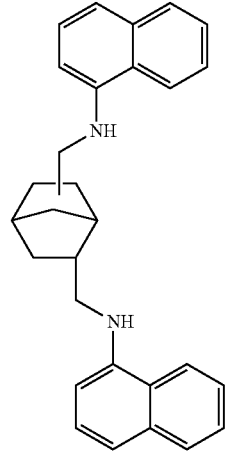

Chemical Formula (1)

(2) Synthesis of Intermediate 2

First, 8.46 g (20.8 mmol) of the intermediate 1, 13.5 g (41.6 mmol) of 4,4'-bis(dimethylamino)benzophenone (manufactured by Tokyo Chemical Industry Co., Ltd.) and 60 mL of toluene were mixed and stirred at 45 to 50° C. Then, 6.38 g (51.5 mmol) of phosphorus oxychloride (manufactured by Wako Pure Chemical Industries, Ltd.) was added thereto in a dropwise manner, and the mixture was refluxed for 2 hours and then cooled. After a reaction was completed, the toluene was decanted. A resinous precipitate was dissolved by adding 40 mL of chloroform, 40 mL of water and concentrated hydrochloric acid thereto, and a chloroform layer was separated. The chloroform layer was washed with water and dried and condensed with magnesium sulfate. Then, 65 mL of ethyl acetate was added to the condensed product and refluxed. After cooling, a precipitate was obtained by filtration, thereby obtaining 15.9 g of the intermediate 2 represented by the following chemical formula (2) (yield 70%).

From the following analysis results, the obtained compound was confirmed to be a desired compound.

MS(ESI) (m/z): 511 (+), divalent

Values of elemental analysis: CHN actual measurement values (78.13%, 7.48%, 7.78%); theoretical values (78.06%, 7.75%, 7.69%)

Chemical Formula (2)

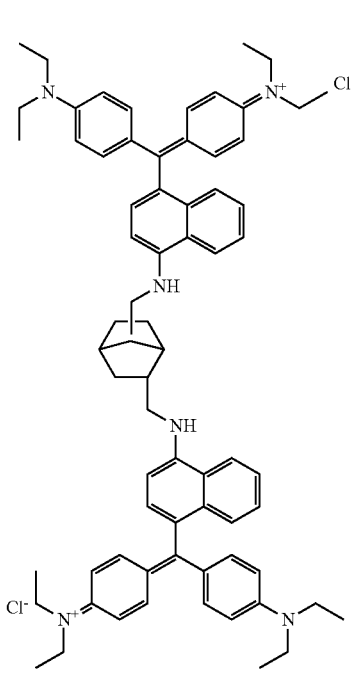

(3) Production of Color Material A

First, 5.00 g (4.58 mmol) of the intermediate 2 was added to 300 ml of water and dissolved at 90° C. to obtain an intermediate 2 solution. Next, 10.44 g (3.05 mmol) of phosphotungstic acid n-hydrate $H_3[PW_{12}O_{40}].nH_2O$ (n=30) (manufactured by Nippon Inorganic Colour & Chemical Co., Ltd.) was added to 100 mL of water and stirred at 90° C. to prepare a phosphotungstic acid aqueous solution. At 90° C., the intermediate 2 solution was mixed with the phosphotungstic acid aqueous solution. The resulting precipitate was obtained by filtration and washed with water. The thus-obtained cake was dried, thereby obtaining 13.25 g of the color material A represented by the following chemical formula (3) (yield 98%).

From the following analysis results, the obtained compound was confirmed to be a desired compound (molar ratio W/Mo=100/0).

MS(ESI) (m/z): 510 (+), divalent

Values of elemental analysis: CHN actual measurement values (41.55%, 5.34%, 4.32%); theoretical values (41.66%, 5.17%, 4.11%)

By the $^{31}$P-NMR, it was also confirmed that the polyoxometalate structure of the phosphotungstic acid was maintained, even after changed into the color material A.

Chemical Formula (3)

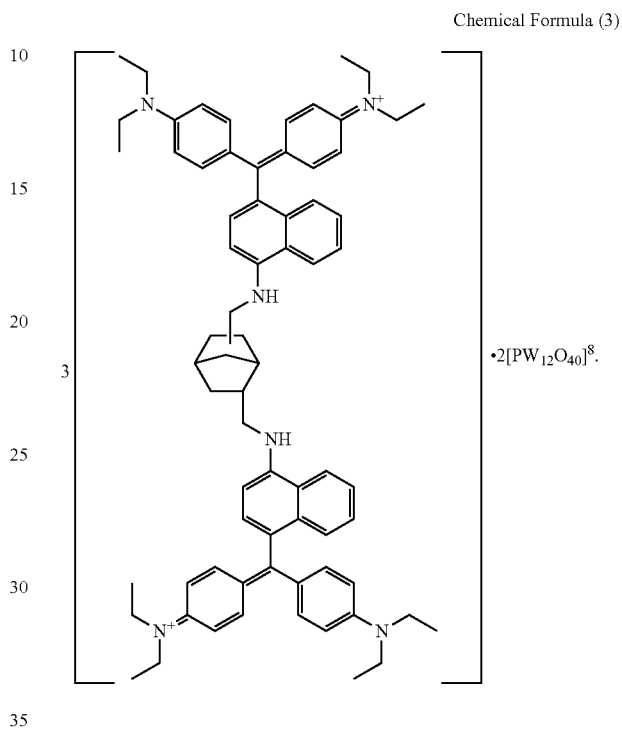

Production Example 2

Production of Color Material B

First, 5.00 g (4.58 mmol) of the intermediate 2 obtained in the above (2) of Production Example 1 was added to 300 ml of water and dissolved at 90° C. to obtain an intermediate 2 solution. Next, 10.23 g (2.99 mmol) of phosphotungstic acid n-hydrate $H_3[PW_{12}O_{40}].nH_2O$ (n=30) (manufactured by Nippon Inorganic Colour & Chemical Co., Ltd.) and 0.144 g (0.06 mmol) of phosphomolybdic acid n-hydrate $H_3[PMo_{12}O_{40}].nH_2O$ (n=30) (manufactured by Nippon Inorganic Colour & Chemical Co., Ltd.) were added to 100 mL of water and stirred at 90° C. to prepare an inorganic acid aqueous solution. At 90° C., the intermediate 2 solution was mixed with the inorganic acid aqueous solution. The resulting precipitate was obtained by filtration and washed with water. The thus-obtained cake was dried, thereby obtaining 12.7 g of the color material B represented by the following chemical formula (4) (yield 95%, molar ratio W/Mo=98/2).

From the following analysis results, the obtained compound was confirmed to be a desired compound.

MS(ESI) (m/z): 510 (+), divalent

Values of elemental analysis: CHN actual measurement values (41.55%, 5.34%, 4.32%); theoretical values (41.66%, 5.17%, 4.11%)

At the time of preparing the inorganic acid aqueous solution, the phosphomolybdic acid in the inorganic acid raw material reacts with part of the phosphotungstic acid into phosphotungstic molybdic acid. By the $^{31}$P-NMR, it was confirmed that the polyoxometalate structures of them were maintained, even after changed into the color material B.

Chemical Formula (4)

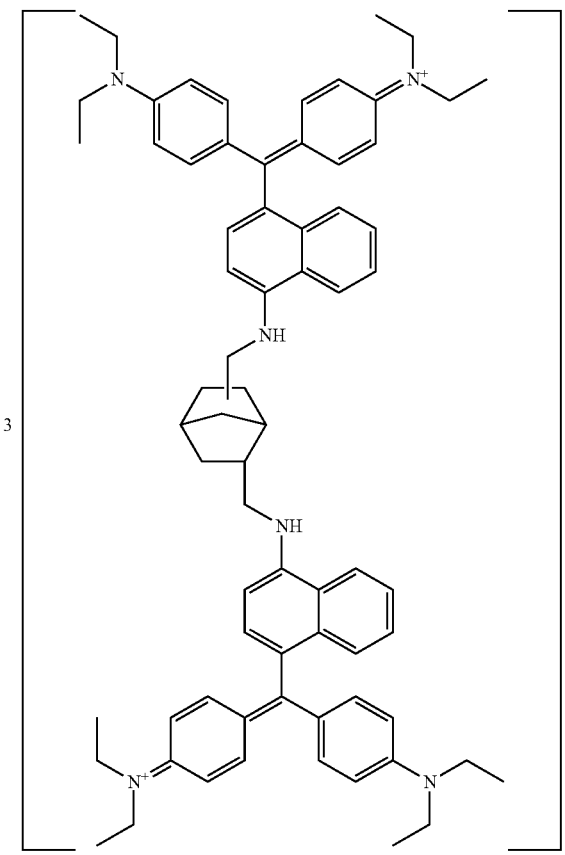

·2[PW$_{11.76}$Mo$_{0.21}$O$_{10}$]$^{8-}$.

Production Example 3

Synthesis of Xanthene-Based Dye A

In a 500 ml four-neck flask, 41.0 parts of a sulfofluoran compound of the following chemical formula (5), 312 parts of methanol, 6.79 parts of N-methyl-2,6-xylidine and 6.13 parts of N-methyl-o-toluidine were put and refluxed for 30 hours. The reaction solution was filtered at 60° C. to remove insoluble substances therefrom. Then, the solvent was removed under a reduced pressure, until the amount of the reaction solution reached about 70 ml. The reaction solution was poured into 200 parts of 6% hydrochloric acid. Then, 600 parts of water was added thereto and the mixture was stirred at room temperature for 30 minutes. Then, a wet cake was obtained by filtration. The wet cake was suspended in 100 parts of water and stirred at 60° C. for 2 hours. Then, the wet cake was obtained again by filtration, washed with hot water at 60° C. and then dried, thereby obtaining the xanthene-based dye A represented by the following chemical formula (6).

Chemical Formula (5)

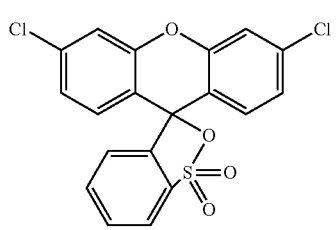

Chemical Formula (6)

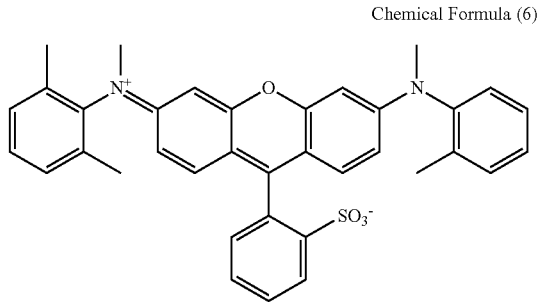

<Evaluation: Insolubility in Solvent>

First, 0.2 g of the color material A obtained in Production Example 1, 0.2 g of the color material B obtained in Production Example 2, 0.2 g of the xanthene-based dye A obtained in Production Example 3, and 0.2 g of Acid Red 289 (AR289 manufactured by Tokyo Chemical Industry Co., Ltd.), which is a xanthene-based dye, were added to 100 g of PGMEA in a 20 mL sample tube. The tube was capped, shaken well for 20 seconds, and then left to stand for 10 minutes. Then, 5 g of the resulting supernatant was filtered to remove insoluble substances. The absorbance spectrum of the resulting filtrate was measured by using a 1 cm cell in an ultraviolet-visible spectrophotometer (UV-2500PC manufactured by Shimadzu Corporation) and the absorbance of each colorant at the maximum absorption wavelength was obtained.

When the absorbance measured in the above condition is 2 or less, it can be said that the colorant is substantially insoluble.

The results are as follows: all of the blue lake pigment A, the blue lake pigment B, the xanthene-based dye A and AR289 have an absorbance of 2 or less, and they have a solubility of 0.2 g/100 g or less in PGMEA.

Production Example 4

Preparation of Photosensitive Binder Component (CR-1)

First, 100 parts by mass of a methacrylic acid/methyl methacrylate/benzyl methacrylate copolymer (molar ratio: 10/30/50, mass average molecular weight: 9,000, acid value: 70 mgKOH/g, active component content: 40% by mass), which is an alkali soluble resin, 60 parts by mass of dipentaerythritol hexaacrylate ("KAYARAD DPHA" manufactured by Nippon Kayaku Co., Ltd.), which is a polyfunctional monomer, 11.1 parts by mass of 2-methyl-1-[4-(methylthio)phenyl]-2-morpholinopropane-1-one ("IRGACURE 907" manufactured by BASF) and 3.7 parts of diethylthioxanthone ("DETX-S" manufactured by Nippon Kayaku Co., Ltd.), which are photoinitiators, and 172.2 parts by mass of PGMEA, which is a solvent, were mixed and stirred homogeneously, thereby obtaining the photosensitive binder component (CR-1).

Production Example 5

Preparation of Color Material Dispersion Liquid (A)

First, 3.0 parts by mass of the color material A of Production Example 1, 4.5 parts by mass of LPN21116 (manufactured by BYK Japan KK, a quaternary ammonium salt type acrylic block copolymer in which an amino group forms a salt, nonvolatile matter 40%), 22.5 parts by mass of propylene glycol monomethyl ether acetate (hereinafter referred to as PGMEA, manufactured by DAICEL Chemical Industries, Ltd.) and 30 parts by mass of 2 mm-diameter zirconia beads, were put in a 30 ml mayonnaise jar. The mixture was subjected to preparatory grinding for one hour with a paint shaker (manufactured by Asada Iron Works Co., Ltd.) and the resulting solution was transferred to a different 30 ml mayonnaise jar and mixed with 30 parts by mass of 0.1 mm-diameter zirconia beads. The mayonnaise jar was shaken for 5 hours with the paint shaker, thereby obtaining the color material dispersion liquid (A). Then, 0.1 part by mass of the obtained dispersion liquid (A) was diluted with 9.9 parts by mass of PGMEA and measured for particle size distribution by using a Microtrac UPA particle size analyzer (manufactured by Nikkiso Co., Ltd.) The 50% average particle size of the dispersion liquid (A) was used for evaluation and converted into volume (MV). The result is 114 nm.

Production Example 6

Preparation of Color Material Dispersion Liquid (B)

The color material dispersion liquid (B) of Production Example 6 was obtained in the same manner as Production Example 5, except that the color material B of Production Example 2 was used in place of the color material A. Then, 0.1 part by mass of the obtained color material dispersion liquid (B) was diluted with 9.9 parts by mass of PGMEA and measured for particle size distribution by using a Microtrac UPA particle size analyzer (manufactured by Nikkiso Co., Ltd.) The 50% average particle size of the dispersion liquid (B) was used for evaluation and converted into volume (MV). The result is 108 nmm.

Comparative Production Example 1

Preparation of Pigment Dispersion Liquid (C)

The pigment dispersion liquid (C) of Comparative Production Example 1 was obtained in the same manner as Production Example 5, except that a commercially-available pigment blue 15:6 pigment (PB15:6) was used in place of the color material A. Then, 0.1 part by mass of the obtained pigment dispersion liquid (C) was diluted with 9.9 parts by mass of PGMEA and measured for particle size distribution by using a Microtrac UPA particle size analyzer (manufactured by Nikkiso Co., Ltd.) The 50% average particle size of the dispersion liquid (C) was used for evaluation and converted into volume (MV). The result is 47 nm.

Comparative Production Example 2

Preparation of Pigment Dispersion Liquid (D)

The pigment dispersion liquid (D) of Comparative Production Example 2 was obtained in the same manner as Production Example 5, except that a commercially-available pigment violet pigment (PV23) was used in place of the color material A. Then, 0.1 part by mass of the obtained pigment dispersion liquid (D) was diluted with 9.9 parts by mass of PGMEA and measured for particle size distribution by using a Microtrac UPA particle size analyzer (manufactured by Nikkiso Co., Ltd.) The 50% average particle size of the dispersion liquid (D) was used for evaluation and converted into volume (MV). The result is 87 nm.

Production Example 7

Preparation of Dye Dispersion Liquid (E)

In a flask, 1,000 parts by mass of methanol was added to 100 parts by mass of Acid Red 289 (AR289, xanthene-based dye, manufactured by Tokyo Chemical Industry Co., Ltd.) and AR289 was dissolved by using a magnetic stirrer. After successful dissolution of AR289 was confirmed, 29.9 parts by mass of concentrated hydrochloric acid was added. The mixture was stirred to change the sulfonic acid salt of AR289 into a sulfo group. To this solution, 1,000 parts by mass of PGMEA was further added. Next, 276 parts by mass of LPN6919 (product name, manufactured by BYK Japan KK, a block polymer containing a block part composed of a repeating unit having a tertiary amine, nonvolatile matter 60%, amine value 120 mgKOH/g, mass average molecular weight 8,000), which is a dispersant, was added thereto and stirred. Then, a reflux cooling tube was connected to the flask. By using a water bath, the temperature of the mixture was increased to 80° C. After the temperature reached 80° C., the mixture was reacted for 4 hours. Then, using an evaporator, the methanol was removed in the water bath at 45° C. After adding 1,000 parts by mass of PGMEA, the mixture was left to stand for 16 hours at room temperature and cooled. Next, the resulting precipitate was obtained by filtration and washed with about 100 parts by mass of PGMEA. The resulting filtrate was collected, thereby obtaining the dye dispersion liquid (E) of Production Example 7, in which the dye was homogenously dispersed. The dispersion liquid (E) was measured for particle size distribution by using a Microtrac UPA particle size analyzer (manufactured by Nikkiso Co., Ltd.) The 50% average particle size of the dispersion liquid (E) was used for evaluation and converted into volume (MV). The result is 78 nm.

Production Example 8

Preparation of Dye Dispersion Liquid (F)

The dye dispersion liquid (F) of Production Example 8, in which the dye was homogenously dispersed, was obtained in the same manner as Production Example 7, except that 100 parts by mass of the xanthene-based dye obtained in Production Example 3 was used in place of Acid Red 289; the amount of the concentrated hydrochloric acid was changed to 17.2 parts by mass; and the amount of LPN6919 was changed to 318 parts by mass. The dispersion liquid (F) was measured for particle size distribution by using a Microtrac UPA particle size analyzer (manufactured by Nikkiso Co., Ltd.) The 50% average particle size of the dispersion liquid (F) was used for evaluation and converted into volume (MV). The result is 86 nm.

Production Example 9

Preparation of Dye Dispersion Liquid (G)

In a flask, 1,000 parts by mass of methanol was added to 100 parts by mass of Acid Red 289 (AR289 manufactured by Tokyo Chemical Industry Co., Ltd.) and AR289 was dissolved by using a magnetic stirrer. After successful dissolution of AR289 was confirmed, 16.46 parts by mass of concentrated hydrochloric acid was added. The mixture was stirred to change the sulfonic acid salt of AR289 into a sulfo group. In addition, 1,000 parts by mass of PGMEA was added thereto. Next, 332 parts by mass of Disperbyk 161 (product name, manufactured by BYK Japan KK, a urethane-based dispersant, nonvolatile matter 30%, amine value 11 mgKOH/g), which is a dispersant, was added thereto and stirred. Then, a reflux cooling tube was connected to the flask. By using a water bath, the temperature of the mixture was increased to 80° C. After the temperature reached 80° C., the mixture was reacted for 4 hours. Then, using an evaporator, the methanol was removed in the water bath at 45° C. After adding 1,000 parts by mass of PGMEA, the mixture was left to stand for 16 hours at room temperature and cooled. Next, the resulting precipitate was obtained by filtration and washed with about 100 parts by mass of PGMEA. The resulting filtrate was collected, thereby obtaining the dye dispersion liquid (G) of Production Example 9, in which the dye was homogenously dispersed. The dispersion liquid (G) was measured for particle size distribution by using a Microtrac UPA particle size analyzer (manufactured by Nikkiso Co., Ltd.) The 50% average particle size of the dispersion liquid (G) was used for evaluation and converted into volume (MV). The result is 68 nm.

Production Example 10

Preparation of Dye Dispersion Liquid (H)

The dye dispersion liquid (H) of Production Example 10, in which the dye was homogeneously dispersed, was obtained in the same manner as Production Example 7, except that 100 parts by mass of the xanthene-based dye A obtained in Production Example 3 was used in place of Acid Red 289; 332 parts by mass of Disperbyk 161 were used; and concentrated hydrochloric acid was not used. The dispersion liquid (H) was measured for particle size distribution by using a Microtrac UPA particle size analyzer (manufactured by Nikkiso Co., Ltd.) The 50% average particle size of the dispersion liquid (H) was used for evaluation and converted into volume (MV). The result is 79 nm.

Example 1

Preparation of Color Material/Dye Co-Dispersion Liquid (I)

First, 2.79 parts by mass of the color material A of Production Example 1, 0.21 part by mass of the xanthene-based dye A obtained in Production Example 3, 4.5 parts by mass of LPN21116 (manufactured by BYK Japan KK, nonvolatile matter 40%), 22.5 parts by mass of propylene glycol monomethyl ether acetate (hereinafter referred to as PGMEA, manufactured by DAICEL Chemical Industries, Ltd.) and 30 parts by mass of 2 mm-diameter zirconia beads were put in a 30 ml mayonnaise jar. The mixture was subjected to preparatory grinding for one hour with a paint shaker (manufactured by Asada Iron Works Co., Ltd.) and the resulting solution was transferred to a different 30 ml mayonnaise jar and mixed with 30 parts by mass of 0.1 mm-diameter zirconia beads. The mayonnaise jar was shaken for 5 hours with the paint shaker, thereby obtaining the colorant dispersion liquid (I) of Example 1 (a co-dispersion liquid of the color material and the dye). Then, 0.1 part by mass of the obtained colorant dispersion liquid (I) was diluted with 9.9 parts by mass of PGMEA and measured for particle size distribution by using a Microtrac UPA particle size analyzer (manufactured by Nikkiso Co., Ltd.) The 50% average particle size of the dispersion liquid (I) was used for evaluation and converted into volume (MV). The result is 128 nm.

Example 2

Preparation of Colorant Dispersion Liquid (J)

First, 90 parts by mass of the color material dispersion liquid (A) of Production Example 5 and 10 parts by mass of the dye dispersion liquid (F) of Production Example 8 were mixed to obtain the colorant dispersion liquid (J) of Example 2. The particle size distribution of the obtained dispersion liquid (J) was measured in the same manner as Example 1. The 50% average particle size of the dispersion liquid (J) was converted into volume (MV). The result is 106 nm.

Comparative Example 1

Preparation of Pigment/Dye Co-Dispersion Liquid (K)

The co-dispersion liquid (K) was prepared in the same manner as Example 1, except that a commercially-available pigment blue 15:6 pigment (PB15:6) was used in place of the color material A. The obtained co-dispersion liquid (K) was a thickened liquid. The obtained dispersion liquid (K) was measured for particle size distribution in the same manner as Example 1. The 50% average particle size of the dispersion liquid (K) was converted into volume (MV). The result is more than 150 nm.

<Evaluation of Dispersibility and Dispersion Stability>

Each of the colorant dispersion liquids of Examples 1 and 2 was stored at 40° C. for one week and then measured for particle size distribution in the same manner as above. The 50% average particle size of the colorant dispersion liquid (I) of Example 1 was converted into volume (MV). The result is 132 nm. The 50% average particle size of the colorant dispersion liquid (J) of Example 2 was also converted into volume (MV). The result is 147 nm.

From the results of Example 1, Example 2 and Comparative Example 1, it is clear that the colorant dispersion liquids of Examples 1 and 2 are excellent in dispersibility. It is also clear that the colorant dispersion liquid of Example 1, in which the color material and the xanthene-based dye were co-dispersed, is particularly excellent in dispersion stability, compared to the colorant dispersion liquid of Example 2, in which the color material dispersion liquid and the xanthene-based dye dispersion liquid were mixed.

Example 3

Preparation of Color Resin Composition

First, 3.14 parts by mass of the color material dispersion liquid (A), 0.70 part by mass of the dye dispersion liquid (E), 2.07 parts by mass of a methacrylic acid/methyl methacrylate/benzyl methacrylate copolymer (molar ratio: 10/30/50, mass average molecular weight: 9,000, acid value: 70 mgKOH/g, active component content: 40% by mass), 0.59 part by mass of a dipentaerythritol hexaacrylate monomer ("ARONIX M-403" manufactured by TOAGOSEI Co., Ltd.), 0.38 part by mass of IRGACURE 907 (manufactured by BASF), 0.08 part by mass of KAYACURE DETX-S (manufactured by Nippon Kayaku Co., Ltd.), 0.03 part by mass of KBM503 (manufactured by Shin-Etsu Chemical Co., Ltd.), 0.0003 part by mass of MEGAFACE R08MH (manufactured by DIC) and 9.09 parts by mass of PGMEA were mixed, stirred and filtered with a 0.25 µm mesh, thereby obtaining the color resin composition of Example 3.

Examples 4 to 10

Preparation of Color Resin Compositions

The color resin compositions of Examples 4 to 10 were obtained in the same manner as Example 3, except that the color material dispersion liquid (A) and the dye dispersion liquid (E) were changed to combinations shown in the following Table 1, and the mixing ratio of the colorants was changed so that x=0.145 when the chromaticity after post-baking at 230° C. for 30 minutes was y=0.09.

Example 11

Preparation of Color Resin Composition

The color resin composition of Example 11 was obtained in the same manner as Example 3, except that 3.84 parts by mass of the colorant dispersion liquid (I) of Example 1 was used in place of the color material dispersion liquid (A) and the dye dispersion liquid (E).

Example 12

Preparation of Color Resin Composition

The color resin composition of Example 12 was obtained in the same manner as Example 4, except that 0.04 part by mass of hindered phenol-based antioxidant IRGANOX 1010 (manufactured by BASF) was additionally added.

Comparative Examples 2 to 4

Preparation of Comparative Color Resin Compositions

The comparative color resin compositions 2 to 4 were obtained in the same manner as Example 3, except that the colorant dispersion liquid (A) and the dye dispersion liquid (E) were changed to combinations shown in the following Table 1.

Comparative Example 5

Preparation of Comparative Color Resin Composition

The comparative color resin composition of Comparative Example 5 was obtained in the same manner as Example 3, except that the dye dispersion liquid (E) was changed to 0.07 part by mass of a 4.5% by mass solution of AR289 in methanol.

TABLE 1

|  | Colorant (1) | Dispersion liquid | Colorant (2) | Dispersion liquid or solution |
|---|---|---|---|---|
| Example 3 | Color material A | Color material dispersion liquid (A) | AR289 | Dye dispersion liquid (E) |
| Example 4 | Color material A | Color material dispersion liquid (A) | Xanthene-based dye A | Dye dispersion liquid (F) |
| Example 5 | Color material A | Color material dispersion liquid (A) | AR289 | Dye dispersion liquid (G) |
| Example 6 | Color material A | Color material dispersion liquid (A) | Xanthene-based dye A | Dye dispersion liquid (H) |
| Example 7 | Color material B | Color material dispersion liquid (B) | AR289 | Dye dispersion liquid (E) |
| Example 8 | Color material B | Color material dispersion liquid (B) | Xanthene-based dye A | Dye dispersion liquid (F) |
| Example 9 | Color material B | Color material dispersion liquid (B) | AR289 | Dye dispersion liquid (G) |
| Example 10 | Color material B | Color material dispersion liquid (B) | Xanthene-based dye A | Dye dispersion liquid (H) |
| Example 11 | Color material A | Co-dispersion liquid (I) | Xanthene-based dye A | Co-dispersion liquid (I) |
| Example 12 | Color material A | Color material dispersion liquid (A) | Xanthene-based dye A | Dye dispersion liquid (F) |
| Comparative Example 2 | PB15:6 | Pigment dispersion liquid (C) | xanthene-based dye A | Dye dispersion liquid (F) |
| Comparative Example 3 | Color material A | Color material dispersion liquid (A) | PV23 | Pigment dispersion liquid (D) |
| Comparative Example 4 | PB15:6 | Pigment dispersion liquid (C) | PV23 | Pigment dispersion liquid (D) |
| Comparative Example 5 | Color material A | Color material dispersion liquid (A) | AR289 | Dye solution |

<Evaluation of Optical Properties>

The evaluation of optical properties was carried out as follows. Each of the color resin compositions of Examples 3 to 12 and Comparative Examples 2 to 5 was applied onto a glass substrate having a thickness of 0.7 mm ("NA35" manufactured by NH Techno Glass Corporation) by using a spin coater, heat-dried on a hot plate at 80° C. for 3 minutes, and then irradiated with ultraviolet light at 60 mJ/cm², by using a ultrahigh-pressure mercury lamp, not through a photomask, thereby obtaining a cured film (blue color film). The thickness of the heat-dried film (T: μm) was adjusted so that the chromaticity after the below-described post-baking was y=0.090. The glass plate having the color film formed thereon was subjected to post-baking in a clean oven at 230° C. for 30 minutes. The thus-obtained color film was measured for contrast, chromaticity (x, y) and luminance (Y). The contrast was measured by using contrast measuring device "CT-1B" manufactured by Tsubosaka Electric Co., Ltd. The chromaticity and luminance were measured by using microscopic spectrophotometer "OSP-SP200" manufactured by Olympus Corporation.

In the above evaluation of optical properties, the following apply when x=0.090 and y=0.145 after post-baking: "⊚" indicates that the value of luminance Y was 11.5 or more; "○" indicates that the value of luminance Y was 11.0 or more and less than 11.5; and "x" indicates that the value of luminance Y was less than 11.0. The results are shown in Table 2.

TABLE 2

|  | After post-baking (230° C., 30 min) | | | Evaluation of luminance after post-baking |
| --- | --- | --- | --- | --- | --- |
|  | x | y | Y (Luminance) | Contrast |  |
| Example 3 | 0.145 | 0.090 | 11.53 | 3565 | ⊚ |
| Example 4 | 0.145 | 0.090 | 11.65 | 3621 | ⊚ |
| Example 5 | 0.145 | 0.090 | 11.45 | 3159 | ○ |
| Example 6 | 0.145 | 0.090 | 11.53 | 3254 | ⊚ |
| Example 7 | 0.145 | 0.090 | 11.32 | 3352 | ○ |
| Example 8 | 0.145 | 0.090 | 11.45 | 3512 | ○ |
| Example 9 | 0.145 | 0.090 | 11.20 | 3028 | ○ |
| Example 10 | 0.145 | 0.090 | 11.36 | 3193 | ○ |
| Example 11 | 0.145 | 0.090 | 11.72 | 3618 | ⊚ |
| Example 12 | 0.145 | 0.090 | 11.85 | 3657 | ⊚ |
| Comparative Example 2 | 0.145 | 0.090 | 10.85 | 2758 | x |
| Comparative Example 3 | 0.145 | 0.090 | 10.98 | 3251 | x |
| Comparative Example 4 | 0.145 | 0.090 | 9.91 | 3451 | x |

From the results shown in Table 2, it is clear that the color layer formed by using the color resin composition of the present invention, in which the colorant containing the color material represented by the general formula (I) and the xanthene-based dye is dispersed in the solvent by the dispersant, is a high luminance color layer which has better heat resistance than color layers using conventional dyes and which is prevented from color deterioration upon heating. Comparative Examples 2 to 4 have excellent heat resistance since they contain a pigment(s) as the colorant. However, they showed poor luminance even before they were subjected to post-baking, so that they could not achieve luminances as high as Examples 3 to 12.

In the case of the color resin composition of Comparative Example 5 in which the dye solution was used, AR289 was remarkably precipitated at the time when, after the color resin composition was applied by using the spin coater and heat-dried on the hot plate at 80° C. for 3 minutes, most of the solvent was volatilized, because the solubility of AR289 was decreased. On the substrate subjected to the post-baking, the luminance of a part where the precipitated AR289 was not present, was measured. The luminance measured was 10 or less. This is presumed to be because the heat resistance was decreased by using the dye solution and, moreover, the heat resistance was further decreased since part of the color material A was dissolved in the methanol.

From comparisons between Examples 3 and 7, Examples 4 and 8, Examples 5 and 9, and Examples 6 and 10, it is clear that in the case of the color material represented by the general formula (I), the color layers of Examples 3 to 6 using the color material A in which the anion is a phosphotungstate ion, showed higher luminances after the post-baking, compared to Examples using the color material B, and they have better heat resistance.

From comparisons between Examples 3 and 4, Examples 5 and 6, Examples 7 and 8, and Examples 9 and 10, it is clear that the color layers of Examples 4, 6, 8 and 10 using the xanthene-based dye A, showed higher luminances after the post-baking, compared to Examples using AR289, and they have better heat resistance.

Example 11 in which the color material A and the xanthene-based dye A were co-dispersed, showed a much higher luminance after the heating, compared to Example 4 in which the dispersion liquid of the color material A and the dispersion liquid of the xanthene-based dye A were separately prepared. From this result, it is clear that the color resin composition prepared by using the co-dispersion liquid has particularly excellent heat resistance.

It is clear that Example 12 using the antioxidant has better heat resistance than Example 4 containing no antioxidant.

The color resin compositions of Examples 3 to 12, which have such high luminance and excellent heat resistance, were also evaluated for light resistance.

<Evaluation of Light Resistance>

A substrate which was prepared in the same manner as the evaluation of optical properties and which was subjected to a post-baking treatment, was separately prepared. By using microscopic spectrophotometer "OSP-SP200" manufactured by Olympus Corporation, the color coordinates (L, a, b) of the substrate were measured and determined as $L_1$, $a_1$, $b_1$, respectively.

Next, by using a xenon lamp (weather meter Ci4000 manufactured by ATLAS, inner filter: quarts, outer filter: soda lime with IR-absorbing coating (CIRA)) under atmospheric pressure, the substrate was irradiated at a wavelength of 420 nm and an irradiance of 1.2 W/m² for 70 hours (equivalent to 300 kJ/m²). The color coordinates of the thus-obtained color film were measured again and determined as $L_2$, $a_2$, $b_2$. $\Delta Eab_2$ was calculated by the following formula. The results are shown in Table 3.

$$\Delta Eab = \{(L_2-L_1)^2 + (a_2-a_1)^2 + (b_2-b_1)^2\}^{1/2}$$

In the evaluation, "⊚" indicates that the value of ΔEab is less than 7; "○" indicates that the value of ΔEab is 7 or more and less than 10; "Δ" indicates that the value of ΔEab is 10 or more and less than 15; and "x" indicates that the value of ΔEab is 15 or more. Of them, "⊚", "○" or "Δ" is in the range of practical use. As a result, Examples 8, 10, 11 and 12 were evaluated as "⊚"; Examples 4, 6, 7 and 9 were evaluated as "○"; and Examples 3 and 5 were evaluated as "Δ".

From the above results, it is clear that all of Examples 3 to 12 have excellent light resistance.

While the light resistance of Example 3 is "Δ", the light resistance of Example 4 is "○". From this result, it is clear that the xanthene-based dye A, which is the compound represented by the general formula (II), has better light resistance than AR289, which is a conventional dye. This fact is also indicated by comparisons between Examples 5 and 6, Examples 7 and 8, and Examples 9 and 10.

While the light resistance of Example 4 is "○", the light resistance of Example 8 is "⊚". From this result, it is clear that much better light resistance is obtained by using the color material in which the anion of the general formula (I) is an inorganic acid anion having tungsten and molybdenum. This fact is also indicated by comparisons between Examples 6 and 10, Examples 3 and 7, and Examples 5 and 9.

From a comparison between Examples 4 and 11, it is clear that the coating film of the color resin composition of Example 11, which was prepared by using the co-dispersion liquid, is also excellent in light resistance.

From a comparison between Examples 4 and 12, it is clear that excellent light resistance is obtained by using the antioxidant.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device
201. Divalent or higher cation
202. Divalent or higher anion
203. Ionic bond
210. Molecular association

The invention claimed is:

1. A colorant dispersion liquid comprising (A) a colorant, (B) a dispersant, and (C) a solvent, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

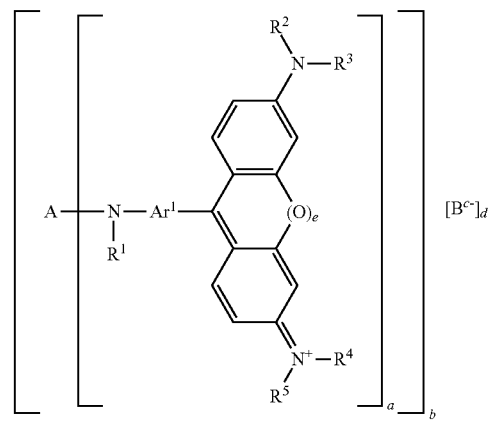

General Formula (I)

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; $B^{c-}$ is a "c"-valent anion; each of $R^1$ to $R^5$ is independently a hydrogen atom, an alkyl group which can have a substituent group, or an aryl group which can have a substituent group; $R^2$ and $R^3$ can be bound to form a ring structure, and/or $R^4$ and $R^5$ can be bound to form a ring structure; $Ar^1$ is a divalent aromatic group which can have a substituent group; a plurality of $R^1$s can be the same or different; a plurality of $R^2$s can be the same or different; a plurality of $R^3$s can be the same or different; a plurality of $R^4$s can be the same or different; a plurality of $R^5$s can be the same or different; and a plurality of $Ar^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

2. The colorant dispersion liquid according to claim 1, wherein the xanthene-based dye is a compound represented by the following general formula (II):

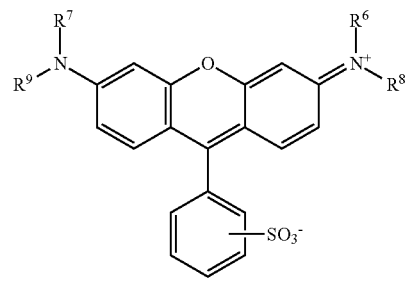

General Formula (II)

wherein each of $R^6$ and $R^7$ is independently an alkyl group or an aryl group, and each of $R^8$ and $R^9$ is independently an aryl group or a heteroaryl group.

3. The colorant dispersion liquid according to claim 1, wherein the dispersant (B) contains a urethane-based dispersant, and at least the xanthene-based dye is dispersed by the urethane-based dispersant.

4. The colorant dispersion liquid according to claim 1, wherein the anion (B$^{c-}$) of the general formula (I) is an inorganic acid anion having a tungsten:molybdenum molar ratio of 100:0 to 90:10.

5. The colorant dispersion liquid according to claim 1, wherein the colorant dispersion liquid further contains an antioxidant.

6. A method for producing a colorant dispersion liquid comprising (A) a colorant, (B) a dispersant, and (C) a solvent, wherein the colorant (A) contains a color material represented by the following general formula (I) and a xanthene-based dye, and a solubility of the color material in the solvent (C) and that of the xanthene-based dye in the solvent (C) are each 0.2 (g/100 g solvent) or less at 23° C., wherein the method comprises a step of adding the color material, the xanthene-based dye and the dispersant (B) to the solvent (C) and co-dispersing the color material and the xanthene-based dye:

General Formula (I)

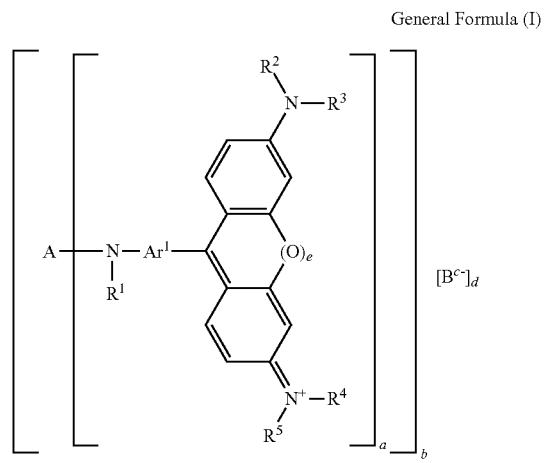

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; Bc⁻ is a "c"-valent anion; each of R$^1$ to R$^5$ is independently a hydrogen atom, an alkyl group which can have a substituent group, or an aryl group which can have a substituent group; R$^2$ and R$^3$ can be bound to form a ring structure, and/or R$^4$ and R$^5$ can be bound to form a ring structure; Ar$^1$ is a divalent aromatic group which can have a substituent group; a plurality of R$^1$s can be the same or different; a plurality of R$^2$s can be the same or different; a plurality of R$^3$s can be the same or different; a plurality of R$^4$s can be the same or different; a plurality of R$^5$s can be the same or different; and a plurality of Ar$^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

7. A color resin composition for color filters, comprising (A) a colorant, (B) a dispersant, (C) a solvent and (D) a binder component, wherein the colorant (A) contains a color material represented by the following general formula (I) and a xanthene-based dye; a solubility of the color material in the solvent (C) and that of the xanthene-based dye in the solvent (C) are each 0.2 (g/100 g solvent) or less at 23° C.; and the color material and the xanthene-based dye are dispersed in the solvent (C) by the dispersant (B):

General Formula (I)

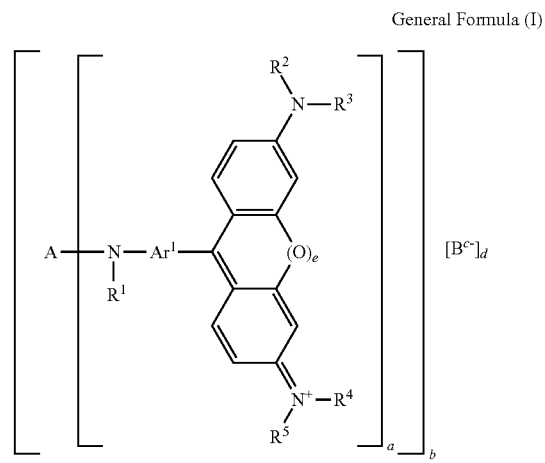

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N can be contained in a carbon chain of the organic group; B$^{c-}$ is a "c"-valent anion; each of R$^1$ to R$^5$ is independently a hydrogen atom, an alkyl group which can have a substituent group, or an aryl group which can have a substituent group; R$^2$ and R$^3$ can be bound to form a ring structure, and/or R$^4$ and R$^5$ can be bound to form a ring structure; Ar$_1$ is a divalent aromatic group which can have a substituent group; a plurality of R$^1$s can be the same or different; a plurality of R$^2$s can be the same or different; a plurality of R$_3$s can be the same or different; a plurality of R$^4$s can be the same or different; a plurality of R$^5$s can be the same or different; and a plurality of Ar$^1$s can be the same or different; and wherein each of "a" and "c" is an integer of 2 or more; each of "b" and "d" is an integer of 1 or more; "e" is 0 or 1 and there is no bond when "e" is 0; and "e"s can be the same or different.

8. The color resin composition for color filters according to claim 7, wherein the xanthene-based dye is a compound represented by the following general formula (II):

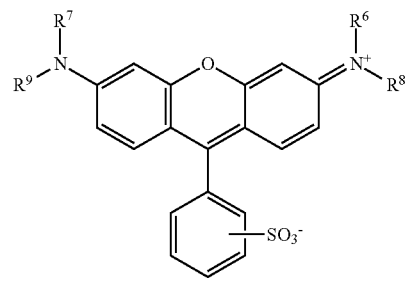

wherein each of R$^6$ and R$^7$ is independently an alkyl group or an aryl group, and each of R$^8$ and R$^9$ is independently an aryl group or a heteroaryl group.

9. The color resin composition for color filters according to claim 7, wherein the dispersant (B) contains a urethane-based dispersant, and at least the xanthene-based dye is dispersed by the urethane-based dispersant.

10. The color resin composition for color filters according to claim 7, wherein the anion (Bc$^-$) of the general formula (I) is an inorganic acid anion having a tungsten:molybdenum molar ratio of 100:0 to 90:10.

11. The color resin composition for color filters according to claim 7, wherein the color resin composition further contains an antioxidant.

12. A color filter comprising at least a transparent substrate and color layers disposed on the substrate, wherein at least one of the color layers is a color layer which is a cured product of the color resin composition defined by any one of claims 7.

13. A liquid crystal display device comprising the color filter defined by claim 12, a counter substrate, and a liquid crystal layer disposed between the color filter and the counter substrate.

14. An organic light-emitting display device comprising the color filter defined by claim 12 and an organic light-emitting material.

\* \* \* \* \*